United States Patent
Lee et al.

(10) Patent No.: US 11,838,398 B2
(45) Date of Patent: Dec. 5, 2023

(54) SEMICONDUCTOR DEVICE

(71) Applicant: Samsung Electronics Co., Ltd., Suwon-si (KR)

(72) Inventors: Hyeonju Lee, Suwon-si (KR); Jiyoung Kim, Suwon-si (KR); Jaehyun Park, Seoul (KR); Seuk Son, Suwon-si (KR); Sooeun Lee, Suwon-si (KR); Dongchul Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/051,138

(22) Filed: Oct. 31, 2022

(65) Prior Publication Data

US 2023/0170891 A1 Jun. 1, 2023

(30) Foreign Application Priority Data

Nov. 26, 2021 (KR) .......................... 10-2021-0165215

(51) Int. Cl.
  *H04L 7/033* (2006.01)
  *H03K 3/037* (2006.01)
  *H03K 5/26* (2006.01)
  *H03K 5/00* (2006.01)

(52) U.S. Cl.
  CPC ............ *H04L 7/033* (2013.01); *H03K 3/037* (2013.01); *H03K 5/26* (2013.01); *H03K 2005/00286* (2013.01)

(58) Field of Classification Search
  CPC ...................................................... H04L 7/033
  See application file for complete search history.

(56) References Cited

U.S. PATENT DOCUMENTS

| | | |
|---|---|---|
| 7,991,103 B2 | 8/2011 | Song |
| 8,483,320 B2 | 7/2013 | Hsu |
| 9,143,316 B1 | 9/2015 | Novellini |
| 9,836,121 B2 | 12/2017 | Wu et al. |
| 10,168,385 B2 | 1/2019 | Lu et al. |
| 10,348,312 B1 | 7/2019 | Novellini et al. |
| | (Continued) | |

FOREIGN PATENT DOCUMENTS

| | | |
|---|---|---|
| EP | 1 901 508 A2 | 3/2008 |
| EP | 1 956 747 A1 | 8/2008 |

OTHER PUBLICATIONS

Extended European Search Report dated Apr. 18, 2023 issued in European Patent Application No. 22209647.1-1213.

*Primary Examiner* — Patrick O Neill
(74) *Attorney, Agent, or Firm* — Harness, Dickey & Pierce, P.L.C.

(57) ABSTRACT

A semiconductor device includes: a data sampler configured to receive a data signal having a first frequency and to sample the data signal with a clock signal having a second frequency, higher than the first frequency, to output data for a time corresponding to a unit interval of the data signal; an error sampler configured to sample the data signal with an error clock signal having the second frequency and a phase, different from a phase of the clock signal, to output a plurality of pieces of error data for the time corresponding to the unit interval; and an eye-opening monitor (EOM) circuit configured to compare the data with each of the plurality of pieces of error data to obtain an eye diagram of the data signal in the unit interval.

20 Claims, 20 Drawing Sheets

(56) References Cited

U.S. PATENT DOCUMENTS

| | | | |
|---|---|---|---|
| 2008/0069196 A1 | 3/2008 | Choi | |
| 2015/0326384 A1* | 11/2015 | Wu | H04L 7/007 375/355 |
| 2023/0143912 A1* | 5/2023 | Ryu | G09G 5/008 345/204 |

* cited by examiner

SEMICONDUCTOR DEVICE

CROSS-REFERENCE TO RELATED APPLICATION(S)

This application claims benefit of priority to Korean Patent Application No. 10-2021-0165215 filed on Nov. 26, 2021 in the Korean Intellectual Property Office, the disclosure of which is incorporated herein by reference in its entirety.

BACKGROUND

Various example embodiments relate to a semiconductor device.

A semiconductor device may operate while exchanging various signals including data and/or commands with another semiconductor device. When one semiconductor device receives a data signal including data from another semiconductor device, the one semiconductor device may sample a data signal with a predetermined and/or dynamically determined clock signal to recover data. Since there is a limitation in increasing a speed at which a signal is exchanged between semiconductor devices, an oversampling operation, in which a data signal is sampled by increasing a frequency of a clock signal in a semiconductor device to increase an operating speed and performance in view of an entire system, has been proposed. However, in the oversampling operation, it may be difficult to obtain an eye diagram (a data eye diagram) representing a waveform of a data signal in a single unit interval.

SUMMARY

Various example embodiments provide a semiconductor device which may more accurately monitor an eye diagram of a data signal in a single unit interval, irrespective of a frequency of a clock signal sampling a data signal on a reception side. By more accurately monitoring the eye diagram, an abnormal eye diagram may more accurately be accommodated and/or addressed. This may provide a technological improvement to the technological problems associated with inaccurately assessing or monitoring of an eye diagram. For example, according to some example embodiments, an abnormal eye diagram may be more likely to be accommodated or addressed. Accordingly, a processing speed of the semiconductor device may be improved and/or a power consumption of the semiconductor device may be reduced based on the monitored eye diagram.

According to an various example embodiments, a semiconductor device includes: a processing circuit configured to receive a data signal having a first frequency and to sample the data signal with a clock signal having a second frequency, greater than the first frequency, to output data for a time corresponding to a unit interval of the data signal, to sample the data signal with an error clock signal having the second frequency and a phase, different from a phase of the clock signal, to output a plurality of pieces of error data for the time corresponding to the unit interval, and to compare the data with each of the plurality of pieces of error data to obtain an eye diagram of the data signal in the unit interval.

According to various example embodiments, a semiconductor device includes: a processing circuit configured to receive a data signal having a first frequency, to sample the data signal with a clock signal having a second frequency, greater than the first frequency, to sequentially output first data and second data, and to sample the data signal with each of error clock signals having the second frequency to sequentially output first error data and second error data, the error clock signals having phase differences from the clock signal, respectively, and to generate an eye diagram of the data signal in a unit interval defined by the first frequency. The processing circuit is configured to compare the second data with the first error data to generate the eye diagram of the data signal in a first time of the unit interval, and compares the second data with the second error data to generate the eye diagram of the data signal in a second time, sequent to the first time, of the unit interval.

According to some example embodiments, a semiconductor device includes: processing circuitry configured to receive a data signal having a first frequency, to sample the data signal with each of a clock signal and an error clock signal having a second frequency, greater than the first frequency, and to sequentially output a plurality of pieces of data and a plurality of pieces of error data during a single period the data signal, to output a single piece of data and ignore the other pieces of data, among the plurality of pieces of data, and to output all of the plurality of pieces of error data when the controller receives the plurality of pieces of data and the plurality of pieces of error data, and to compare the single piece of data with each of the plurality of pieces of error data to generate an eye diagram of the data signal within the single period.

BRIEF DESCRIPTION OF DRAWINGS

The above and other aspects, features, and advantages of various example embodiments will be more clearly understood from the following detailed description, taken in conjunction with the accompanying drawings.

DETAILED DESCRIPTION OF VARIOUS EXAMPLE EMBODIMENTS

Hereinafter, example embodiments will be described with reference to the accompanying drawings.

Figure 1:
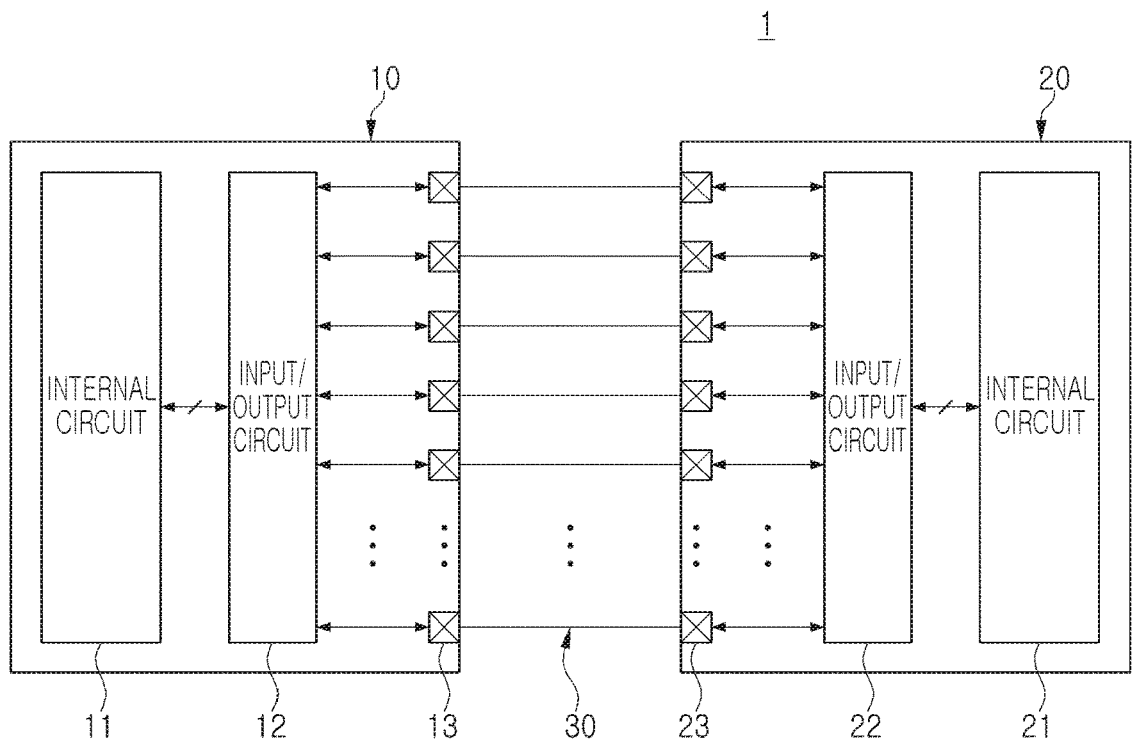
FIGS. 1 and 2 are schematic diagrams of systems including semiconductor devices according to some example embodiments, respectively.
Figure 2:
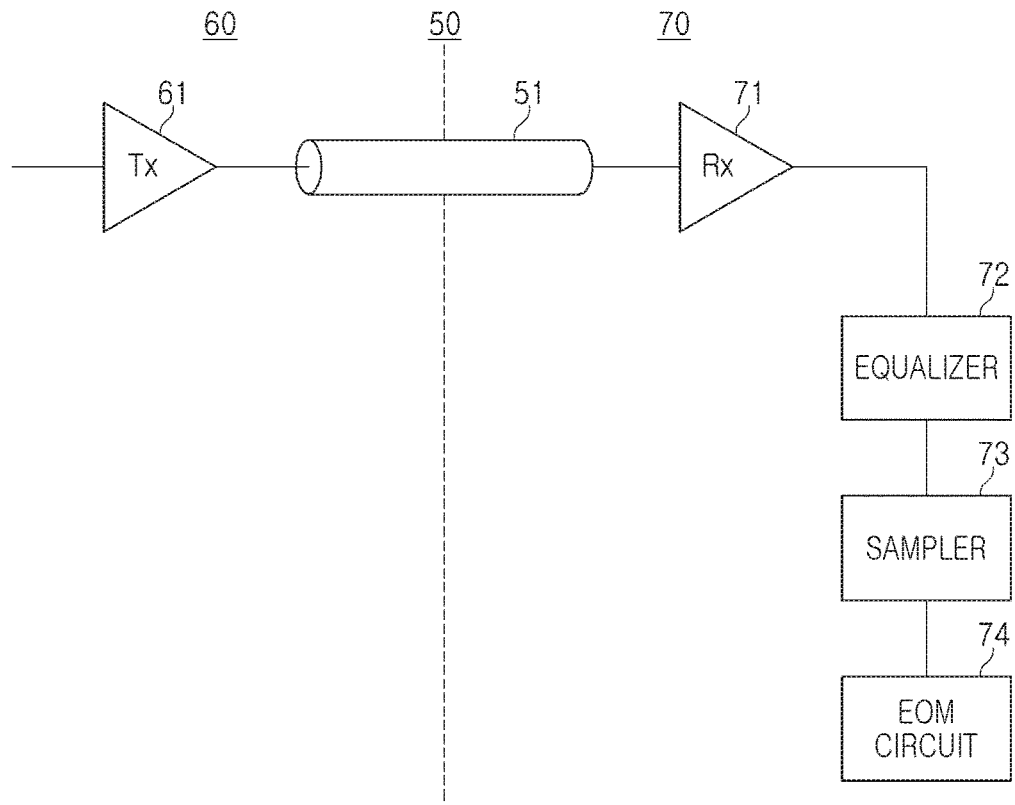

FIGS. 1 and 2 are schematic diagrams of systems including semiconductor devices according to some example embodiments, respectively.

Referring to FIG. 1, a system 1 according to some example embodiments may include a first semiconductor device 10 and a second semiconductor device 20, and the first semiconductor device 10 and the second semiconductor device 20 may be connected to communicate with each other. The first semiconductor device 10 and the second semiconductor device 20 may be connected, e.g. through a wired bus and/or through a wireless bus. The first semiconductor device 10 may include an internal circuit 11, an input/output circuit 12, and a plurality of pads 13. The second semiconductor device 20 may include an internal circuit 21, an input/output circuit 22, and a plurality of pads 23.

In some example embodiments, the internal circuit 11 of the first semiconductor device 10 and the internal circuit 21 of the second semiconductor device 20 may have different structures and may perform at least some different functions. As an example, when the first semiconductor device 10 may be or may include an application processor, the internal circuit 11 may include one or more of a central processing unit (CPU), a graphics processing unit (GPU), a digital signal processor (DSP), a neural processing unit (NPU), a memory interface, a display interface, a power supply circuit, and the like. When the second semiconductor device 20 is or includes a memory device connected to an application processor, the internal circuit 11 may include a memory cell array, in which memory cells are disposed, and peripheral circuits controlling the memory cell array.

The first semiconductor device 10 and the second semiconductor device 20 may be connected to each other through a plurality of transmission paths 30. As an example, the plurality of transmission paths 30 may be provided by an interconnection pattern connecting the pads 13 of the first semiconductor device 10 and the pads 23 of the second semiconductor device to each other, a through-silicon via (TSV), or the like.

In various example embodiments, the first semiconductor device 10 and the second semiconductor device 20 may exchange data signals and/or command signals with each other through a plurality of transmission paths 30. For example, when the first semiconductor device 10 outputs a data signal to the second semiconductor device 20, the second semiconductor device 20 may sample the data signal with a clock signal such as a predetermined clock signal or a variably or dynamically determined clock signal, to recover data desired to be transmitted by the first semiconductor device 10.

In some example embodiments, a frequency of the clock signal, used by the second semiconductor device 20 to sample the data signal, may be different from a frequency of the data signal transmitted through the transmission paths 30. As an example, the second semiconductor device 20 may operate in an oversampling manner in which a data signal is sampled with a clock signal having a frequency, greater than that of the data signal. In the second semiconductor device 20 receiving data, the oversampling manner may be applied to improve a data processing speed of the entire system 1 without or with minimally or marginally increasing a data transmission speed between the first semiconductor device 10 and the second semiconductor device 20.

Referring to FIG. 2, a system 50 may include a semiconductor device 60 on a transmission or transmitter side and a semiconductor device 70 on a reception or receiver side. The semiconductor device 60 on the transmission side may include a transceiver and/or a transmitter 61, and the semiconductor device 70 on the reception side may include a transceiver and/or a receiver 71. An output terminal of the transmitter 61 and an input terminal of the receiver 71 may be connected to each other by a transmission path 51 such as an interconnection pattern, a through-silicon via (TSV), or the like.

The semiconductor device 70 on the reception side may further include an equalizer 72, a sampler 73, an eye open monitoring (EOM) circuit 74, and/or the like, other than the receiver 71. The equalizer 72 may compensate for distortion and/or interference of a signal received by the receiver 71, and may then output the signal. The sampler 73 may operate in synchronization with a predetermined and/or dynamically determined clock signal, and may sample the signal, output from the equalizer 72, to output data included in the signal. Any or all of the equalizer 72, the sampler 73, the EOM circuit 74, and the receiver 71 may be included in or correspond to a processor or a processing circuit. Furthermore some of the functions described below of the equalizer 72, the sampler 73, the EOM circuit 74, and the receiver 71 may be performed by others of the equalizer 72, the sampler 73, the EOM circuit 74, and the receiver 71; example embodiments are not limited thereto.

In some example embodiments, the sampler 73 may include a data sampler that samples the signal output by the equalizer 72 with a clock signal to output data, and an error sampler that samples the signal output by the equalizer 72 with an error clock signal to output error data. The clock signal and the error clock signal may have the same frequency and may have different phases. As an example, the clock signal may be set to have a phase optimized or at least partially optimized or improved to output data by sampling a signal, and the error clock signal may be generated by pushing or pulling the phase of the clock signal.

The EOM circuit 74 may be configured to monitor an eye (or a data eye) of a signal within a single unit interval and may generate, for example, an eye diagram of a signal within a unit interval. The monitoring of the eye may include measurement of various characteristics of an eye diagram, such as but not limited to amplitude measurements such as eye amplitude and/or time measurements such as jitter; however, example embodiments are not limited thereto. When the phase of the clock signal and a reference voltage input to the sampler 73 are determined to sample the signal received through the transmission path 51, the EOM circuit 74 may generate an eye diagram, e.g. may generate internal data corresponding to an eye diagram. The semiconductor device 70 on the reception side may use the eye diagram, output from the EOM circuit 74, to determine whether the phase of the clock signal and the reference voltage are set to good, e.g. acceptable or optimal values at which a signal may be sampled without an error.

In some example embodiments, the EOM circuit 74 may compare the data, output by the data sampler, with the error data, output by the error sampler, to obtain an eye diagram of a signal within a single unit interval. As an example, when the frequency of the clock signal is equal to twice the frequency of the signal (e.g. at the Nyquist frequency of the signal), two pieces of error data may be output within a single unit interval. The EOM circuit 74 may generate an eye diagram of a signal within a single unit interval by comparing the data, output by the data sampler, with each of the two pieces of error data. When the EOM circuit 74 generates the eye diagram, this may correspond to the EOM circuit calculating components of the curve that corresponds to the eye diagram, and does not necessarily mean that the EOM circuit 74 outputs or draws the eye diagram.

Figure 3:
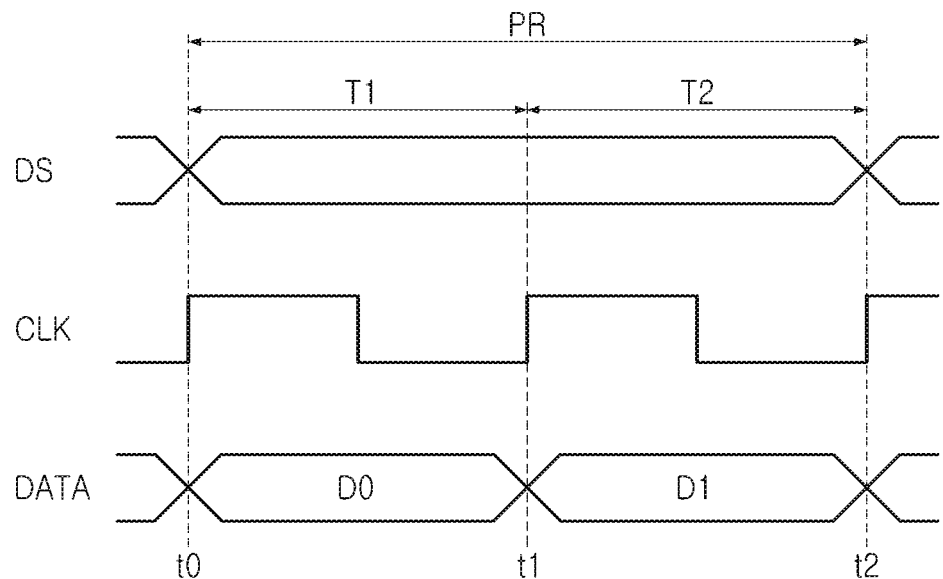
FIGS. 3 and 4 are diagrams illustrating an oversampling operation of a semiconductor device according to some example embodiments.
Figure 4:
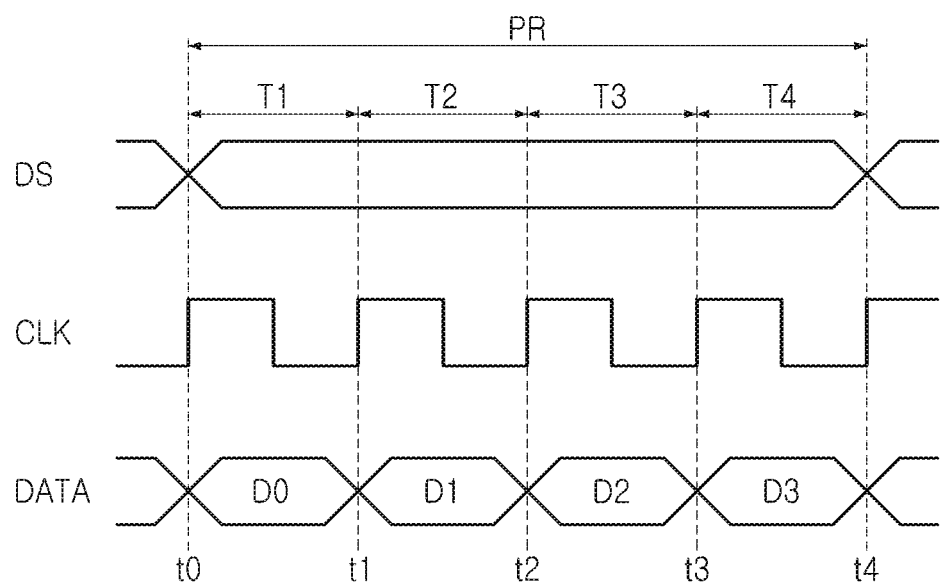

FIGS. 3 and 4 are diagrams illustrating an oversampling operation of a semiconductor device according to some example embodiments.

Referring to FIG. 3, a semiconductor device according to some example embodiments may receive a data signal DS and may sample the data signal DS with a clock signal CLK. A single period of the clock signal CLK may be shorter than a unit interval PR of the data signal DS. In some example embodiments, e.g. as illustrated in FIG. 3, the frequency of the clock signal CLK may be equal to twice the frequency of the data signal DS.

The sampler of the semiconductor device may sample the data signal DS at each rising edge of the clock signal CLK. Accordingly, as illustrated in FIG. 3, the sampler may sample and output the data signal DS twice during the unit interval PR. The sampler may sequentially output first data D0 that is sampled at a first point in time t0, and second data D1 that is sampled at a second point in time t1. As an example, a time between the first point in time t1, at which the first data D0 is output, and a second point in time t2 may be defined as a first time T1, and a time between the second point in t2, at which the second data D1 is output, and a third point in time t3 may be defined as a second time T2.

In various example embodiments for example as illustrated in FIG. 4, a semiconductor device may receive a data signal DS and may sample the received data signal DS with a clock signal CLK. A frequency of the clock signal CLK may be equal to four times a frequency of the data signal DS, and thus, a rising edge of the clock signal CLK may appear four times during a unit interval PR of the data signal DS.

Accordingly, the sampler may sequentially output first data D1 to fourth data D3 during the unit interval PR of the data signal DS. The sampler may output each of the first data D0 to the fourth data D3 at each of the first to fourth times T1 to T4.

Figure 5:
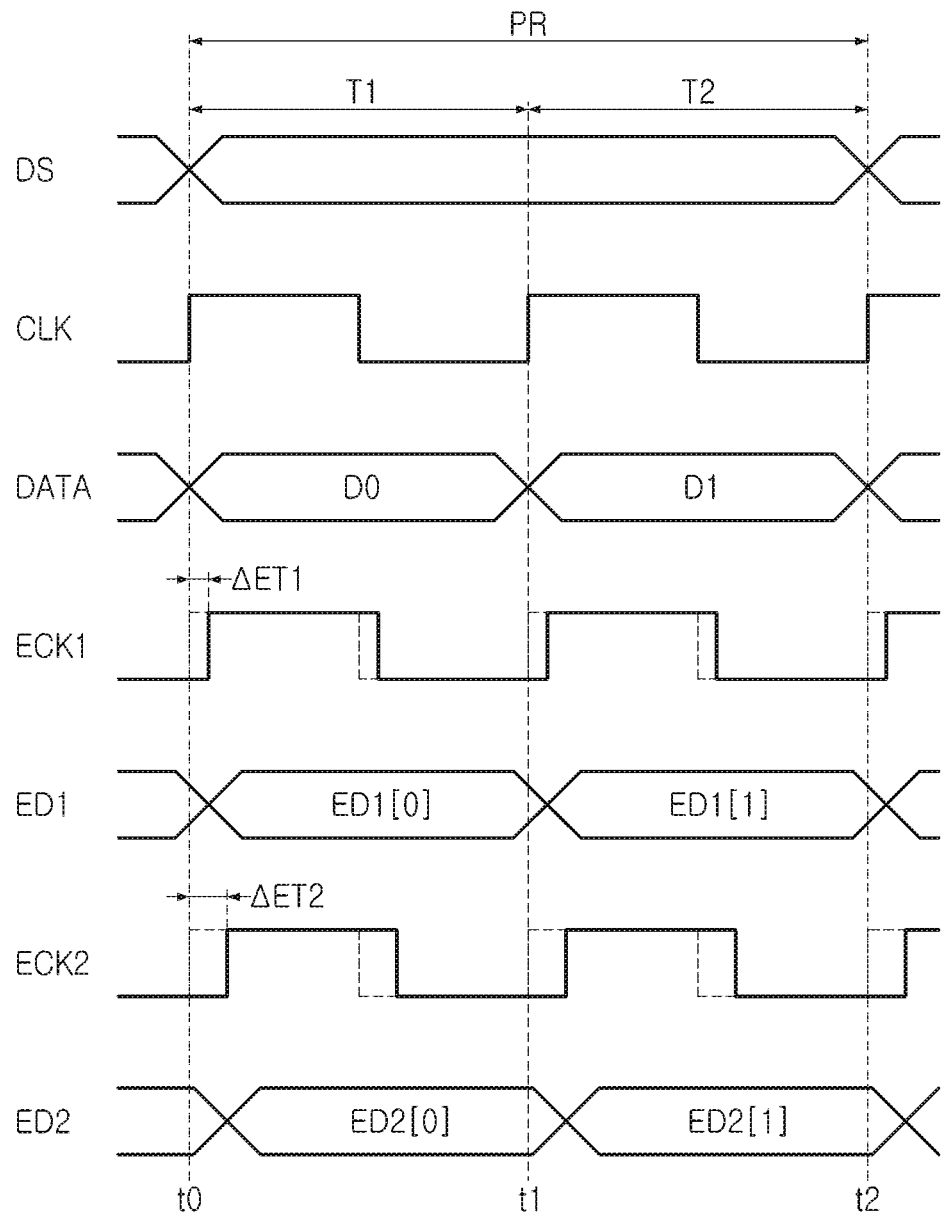
FIGS. 5 and 6 are diagrams illustrating operations of a semiconductor device according to some example embodiments.
Figure 6:
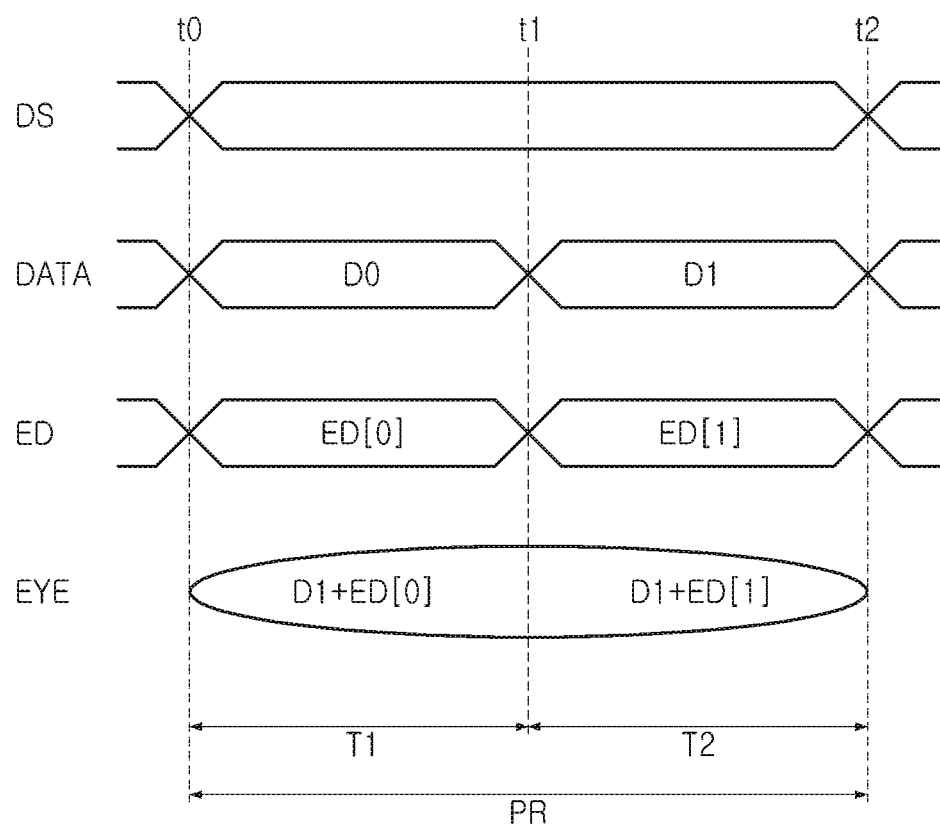

FIGS. 5 and 6 are diagrams illustrating operations of a semiconductor device according to some example embodiments.

FIGS. 5 and 6 may be diagrams illustrating operations of a semiconductor device in some example embodiments in which a frequency of a clock signal CLK is equal to twice a frequency of a data signal DS. As described above, a sampler of the semiconductor device receiving a data signal DS may include a data sampler, sampling the data signal DS with the clock signal CLK, and an error sampler sampling the data signal DS with error clock signals ECK1 and ECK2. Although two error clock signals ECK1 and ECK2 are illustrated, example embodiments are not necessarily limited thereto. For example, there may be more than two error clock signals, or less than two error clock signals.

Referring to FIG. 5, the clock signal CLK may be set to have a phase improved or optimized to sample the data signal DS. On the other hand, each of the error clock signals ECK1 and ECK2 may have different phases, e.g. each may have a phase, different from that of the clock signal CLK. Thus, the error sampler may sample the data signal DS at a point in time, different from that of the data sampler. The data sampler may sample the data sampler with the clock signal CLK at a first point in time t0 and a second point in time t1 to obtain first data D0 and second data D1 and may output the obtained first data D0 and the obtained second data D1.

The error sampler may sample the data signal DS with one of the first error clock signal ECK1 and the second error clock signal ECK2 to sample the data signal DS at points in time, respectively later than the first point in time t0 and the second point in time t1 by predetermined or dynamically determined error times $\Delta ET1$ and $\Delta ET2$. As an example, the error sampler may sample the data signal DS at a rising edge of the first error clock signal ECK1 to output a plurality of pieces of error data ED1[0] and ED1[1], and may then sample a data signal at a rising edge of the error clock signal ECK2A to output a plurality of pieces of error data ED2[0] and ED2[1]. The duty cycle of either or both of the error clock signals ECK1 and ECK2 may be the same as that of the clock signal CLK; however, example embodiments are not limited thereto.

According to some example embodiments, the error sampler may sample the data signal DS a plurality of times in synchronization with the first error clock signal ECK1, and may sample the data signal DS a plurality of times in synchronization with the second error clock signal ECK2. For example, during an interval having a plurality of intervals of the first error clock signal ECK1, the error sampler may receive the first error clock signal ECK1 to output the plurality of pieces of error data ED1[0] and ED1[1], and may then input the second error clock signal ECK2 to the error sampler. The error sampler may sequentially receive a plurality of error clock signals having different phases from the first and second error clock signals ECK1 and ECK2 after the second error clock signal ECK2, and may output error data.

The EOM circuit of the semiconductor device may compare at least one of the first data D0 and the second data D1 with each of the plurality of pieces of first error data ED[0] and the plurality of pieces of second error data ED[1], and may use the first data D0 and the second data D1, along with the plurality of pieces of first error data ED[0] and the plurality of pieces of first error data ED[0] and the plurality of pieces of second error data ED[1] to generate an eye diagram of the data signal DS within a single unit interval PR. The plurality of pieces of first error data ED[0] may be or may include error data ED1[0] and error data ED2[0] output by the error sampler during a first time T1. On the other hand, the plurality of pieces of second error data ED[1] may be or may include error data ED1[1] and error data ED2[1] output by the error sampler during a second time T2.

The EOM circuit may compare the second data D1 with the plurality of pieces of first error data ED[0] to obtain an eye diagram of the data signal DS at the first time T1. Also, the EOM circuit may compare the second data D1 with the plurality of pieces of second error data ED[1] to obtain an eye diagram of the data signal DS at second time T2. Accordingly, in a semiconductor device operating in an oversampling manner in which a frequency of the clock signal CLK is greater than a frequency of the data signal DS, the eye diagram of the data signal DS may be more accurately generated and/or assessed in a single unit interval PR.

Figure 7:
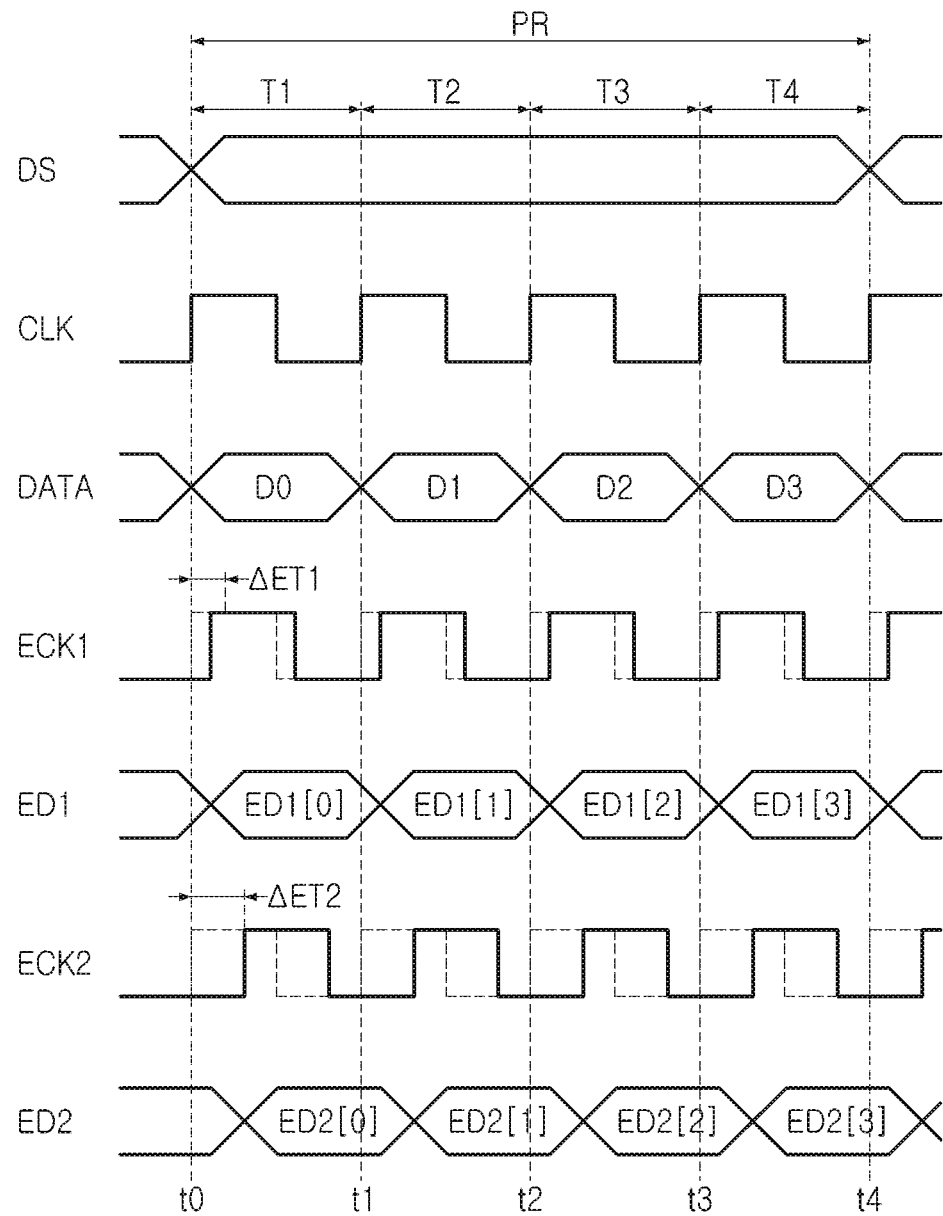
FIGS. 7 and 8 are diagrams illustrating operations of a semiconductor device according to some example embodiments.
Figure 8:
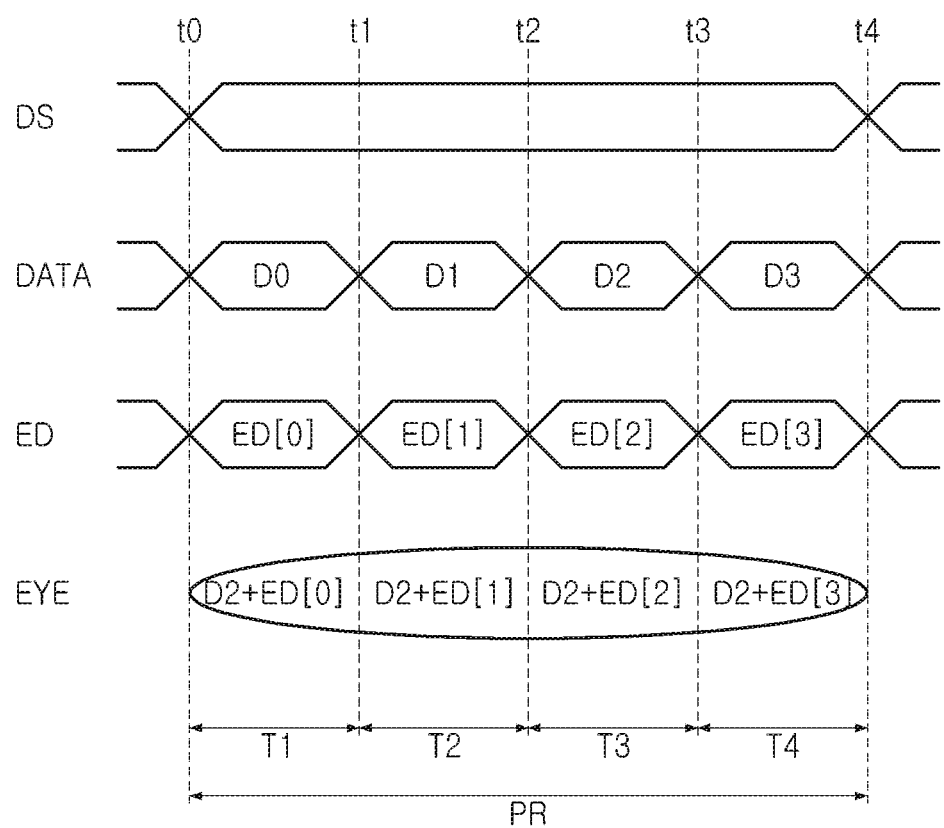

FIGS. 7 and 8 are diagrams illustrating operations of a semiconductor device according to some example embodiments.

FIGS. 7 and 8 may be diagrams illustrating operations of a semiconductor device in some example embodiments in which a frequency of a clock signal CLK is equal to four times a frequency of a data signal DS. As described above, a sampler of the semiconductor device receiving the data signal DS may include a data sampler that samples the data signal DS with the clock signal CLK, and an error sampler that samples the data signal DS with error clock signals ECK1 and ECK2.

Referring to FIG. 7, the clock signal CLK may be set to sample the data signal DS at a particular, such as at an optimal point in time. Each of the error clock signals ECK1 and ECK2 may have different phases, and may e.g., have a phase, different from that of the clock signal CLK. As an example, the first error clock signal ECK1 may be a clock signal delayed by first error time ΔET1 of the clock signal CLK, and the second error clock signal ECK2 may be a clock signal delayed from the clock signal CLK by error time ΔET2. In some example embodiments, ΔET2 may be twice ΔET1; however, example embodiments are not limited thereto.

Accordingly, the error sampler receiving one of the error clock signals ECK1 and ECK2 may sample the data signal DS at a point in time, different from that of the data sampler. The data sampler may sample the data sampler with the clock signal CLK at a first point in time t0, a second point in time t1, a third point in time t2, and a fourth point in time t3 to obtain first data D0, second data D1, third data D2, and fourth data D3. The data sampler may sequentially output the first data D0 to the fourth data D3.

The error sampler may sample the data signal DS with one of the first error clock signal ECK1 and the second error clock signal ECK2, and thus may sample the data signal DS at points in time, respectively later than the first to fourth points in time t0 to t3 by error times ΔET1 and ΔET2. As an example, the error sampler may sample the data signal DS at a rising edge of the first error clock signal ECK1 to output a plurality of pieces of error data ED1[0] to ED1 [3], and may then sample a data signal at a rising edge of the error clock signal ECK2 to output a plurality of pieces of error data ED2[0] to ED2[3].

As described above, the error sampler may sample the data signal DS a plurality of times in synchronization with the first error clock signal ECK1, and may sample the data signal DS a plurality of times in synchronization with the second error clock signal ECK2. During a predetermined or variably determined time including a plurality of periods of the first error clock signal ECK1, the error sampler may receive the first error clock signal ECK1 to output the plurality of pieces of error data ED1 [0] to ED1 [3], and may then sample the data signal DS in synchronization with the second error clock signal ECK2. The error sampler may sample the data signal DS in synchronization with the second error clock signal ECK2, and may then further receive a plurality of error clock signals having phases, different from those of the first and second error clock signals ECK1 and ECK2, to output a plurality of pieces of error data.

The EOM circuit of the semiconductor device may compare at least one of the first data D0 to the fourth data D3 with each of a plurality of pieces of first error data ED[0], a plurality of pieces of second error data ED[1]), a plurality of pieces of third error data ED[2], and a plurality of pieces of fourth error data ED[3] to generate an eye diagram, or data corresponding to the eye diagram, of the data signal DS within a single unit interval PR. As an example, the EOM circuit may compare the third data D2, among the first data D0 to the fourth data D3, with the plurality of pieces of error data to generate an eye diagram.

The plurality of pieces of first error data ED[0] may include error data ED1 [0] and error data ED2 [0] output by the error sampler during the first time T1. The plurality of pieces of second error data ED[1] may include error data ED1[1] and error data ED2[1] output by the error sampler during the second time T2. The plurality of pieces of third error data ED[2] may include error data ED1 [2] and error data ED2[2] output by the error sampler during the third time period T3, and the plurality of pieces of fourth error data ED[3] may include error data ED1 [3] and error data ED2[3] output by the error sampler during the fourth time T4.

The EOM circuit may compare the third data D2 with the plurality of first error data ED[0] to obtain an eye diagram or data corresponding to the eye diagram of the data signal DS at the first time T1, and may compare the third data D2 with the plurality of pieces of second error data ED[1] to obtain the eye diagram or data corresponding to the eye diagram of the data signal DS at the second time T2. Also, the EOM circuit may compare the third data D2 with the plurality of pieces of third error data ED[2] to obtain the eye diagram or data corresponding to the eye diagram of the data signal DS at the third time T3, and may compare the third data D2 with the plurality of pieces of fourth error data ED[3] to obtain the eye diagram or data corresponding to the eye diagram of the data signal DS at the fourth time T4. Accordingly, in a semiconductor device operating in an oversampling manner in which a frequency of the clock signal CLK is higher than a frequency of the data signal DS, the eye diagram of the data signal DS may be more accurately generated and/or assessed in a single unit interval PR.

The operations in the case, in which the frequency of the clock signal CLK is equal to twice or four times the frequency of the data signal DS, have been described with reference to FIGS. 5 to 8, but example embodiments are not limited to the case in which the frequency of the clock signal CLK is equal to twice or four times the frequency of the data signal DS. The frequency of the clock signal CLK may be a multiple such as an integer multiple of the frequency of the data signal DS.

Figure 9:
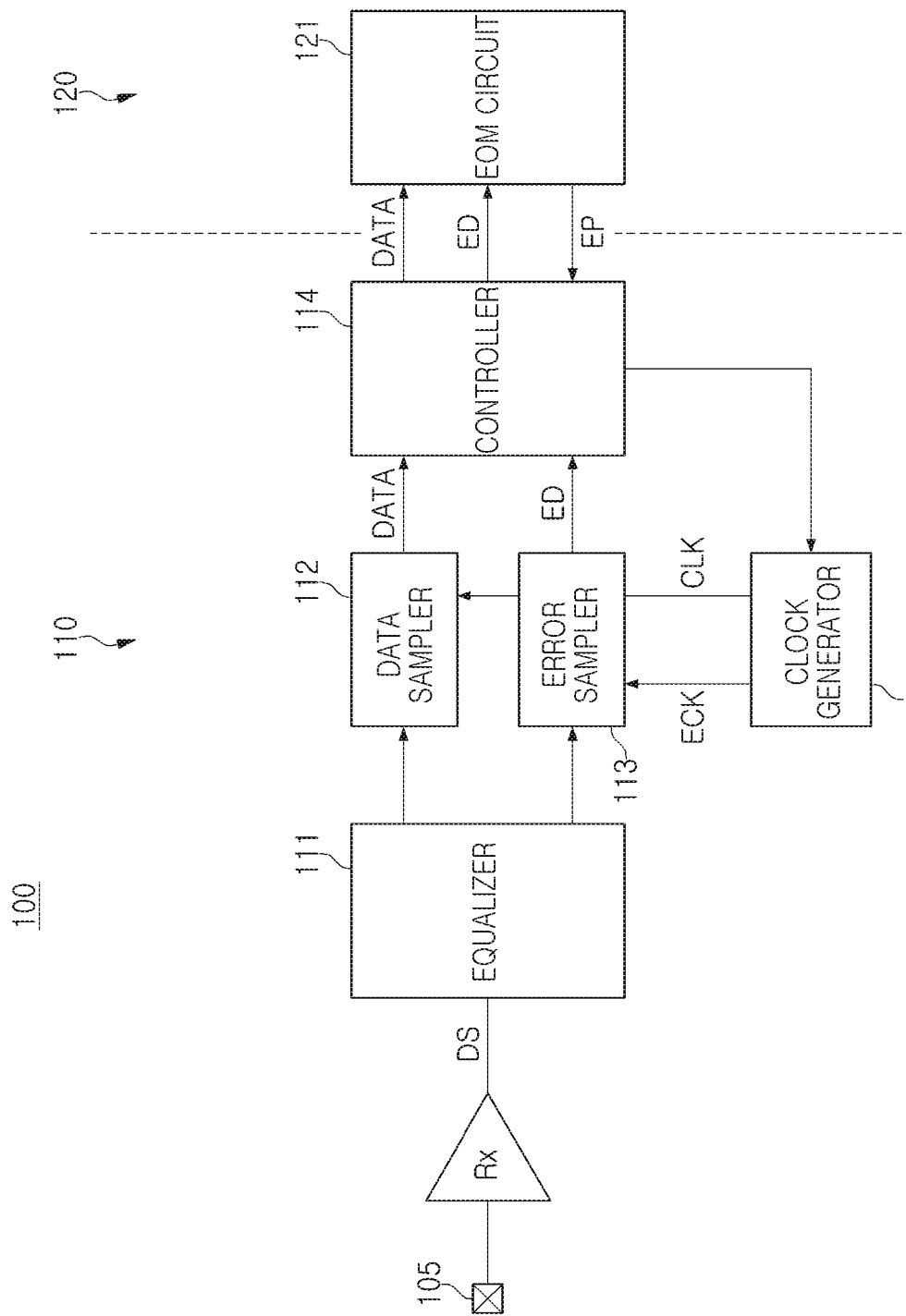
FIG. 9 is a schematic block diagram of a semiconductor device according to some example embodiments.

FIG. 9 is a schematic block diagram of a semiconductor device according to some example embodiments.

Referring to FIG. 9, a semiconductor device 100 according to some example embodiments may include an analog circuit region 110, connected to a pad 105 to receive a signal, and a digital circuit region 120 connected to the analog circuit region 110. The analog circuit region 110 may include a receiver Rx, an equalizer 111, a data sampler 112, an error sampler 113, a controller 114, a clock generator 115, and the like. An EOM circuit 121, generating an eye diagram of a data signal DS received by the receiver Rx, may be included in the digital circuit region 120.

The receiver Rx may receive the data signal DS from another semiconductor device connected to the pad 105, and may transmit the received data signal DS to the equalizer 111. The equalizer 111 may compensate for and output interference and/or distortion of the data signal DS. As an example, the equalizer 111 may remove the interference and/or distortion of the data signal DS and may output the data to the data sampler 112 and the error sampler 113. Accordingly, the data sampler 112 and the error sampler 113 may receive the same data signal DS.

Under the control of the controller 114, the clock generator 115 may output a clock signal CLK and an error clock signal ECK. The clock signal CLK and the error clock signal ECK may have a frequency, higher than that of the data signal DS, and may have different phases. As an example, the clock generator 115 may pull and/or push a phase of the clock signal CLK by a predetermined or dynamically determined error time to generate the error clock signal ECK.

The data sampler 112 may sample the data signal DS in synchronization with the clock signal CLK, and the error sampler 113 may sample the data signal DS in synchronization with the error clock signal ECK. The data sampler 112 may perform a sampling operation to compare the data signal DS with a reference voltage at each rising edge of the clock signal CLK to output data DATA. The error sampler 113 may compare the data signal DS with a reference voltage at each rising edge of the error clock signal ECK to output the error data ED.

Since the frequency of each of the clock signal CLK and the error clock signal ECK is greater than the frequency of the data signal DS, the data sampler 112 may generate a plurality of pieces of data DATA during a unit interval of the data signal DS and the error sampler 113 may also generate a plurality of pieces of error data ED during the unit interval of the data signal DS. However, in some example embodiments, the data sampler 112 may select and output only one of the plurality of pieces of data DATA generated by sampling the data signal DS during a single unit interval, and may ignore remaining pieces of data, other than the selected data. An operation of the data sampler 112 will be described later with reference to FIGS. 10 and 11.

The error sampler 113 may output all of the plurality of pieces of error data ED generated during the single unit interval. As an example, when the frequency of the error clock signal ECK is equal to N times the frequency of the data signal DS (where N is a positive integer greater than or equal to 2), the error sampler 113 may output N pieces of error data ED during the single unit interval.

The controller 114 may adjust the frequencies and/or the phases of the clock signal CLK and the error clock signal ECK output by the clock generator 115. Also, the controller 114 may output the data DATA, output by the data sampler 112, and the error data ED, output by the error sampler 113, to the EOM circuit 121 of the digital circuit area 120. In some example embodiments, the controller 114 may select one of the error data ED output from the error sampler 113, based on error phase information EP received from the EOM circuit 121 and may output the selected error data ED to the EOM circuit 121.

As an example, referring to FIG. 7 together, the controller 114 may receive the first error data ED[0] to the fourth error data ED[3] from the error sampler 113 during each unit interval PR. The controller 114 may select one of the first error data ED[0] to the fourth error data ED[3] with reference to the error phase information EP received from the EOM circuit 121, and may output the selected error data to the EOM circuit 121.

The EOM circuit 121 may compare the data DATA and the error data ED with each other to generate an eye diagram of the data signal DS within a single unit interval. As an example, when the controller 114 outputs the first error data ED[0] among the first error data ED[0] to the fourth error data ED[3], the EOM circuit 121 may compare the error data ED[0] and the data DATA with each other to obtain an eye diagram for the first time T1.

Then, the EOM circuit 121 may generate error phase information EP, requesting the second error data ED[1] to be output, and may output the generated error phase information EP to the controller 114. When the controller outputs the second error data ED[1], the EOM circuit 121 may compare the second error data ED[1] with the data DATA to obtain an eye diagram for the second time T2. The EOM circuit 121 may outputs error phase information EP, requesting the third error data ED[2] to be output, to the controller 114 to receive the third error data ED[2], and may obtain the eye diagram for the third time T3. After obtaining the eye diagram for the third time T3, the EOM circuit 121 may output error phase information EP, requesting the fourth error data ED[3], to the controller 114 to receive the 4 error data ED[3] and to obtain an eye diagram for the fourth time T4. With the above-described operation, the EOM circuit 121 may generate an eye diagram or information corresponding to the eye diagram of the data signal DS corresponding to the single unit interval PR.

The semiconductor device 100 may determine whether a phase of the clock signal CLK input to the data sampler 112 and a level of the reference voltage are appropriate, by using an eye diagram of the data signal DS output by the EOM circuit 121. The semiconductor device 100 may adjust the phase of the clock signal CLK and/or the level of the reference voltage, and may supply a clock signal CLK and a reference voltage, optimized or improved to sample the data signal DS, to the data sampler 121 based on the eye diagram or data associated with the eye diagram output by the EOM circuit 121.

Figure 10:
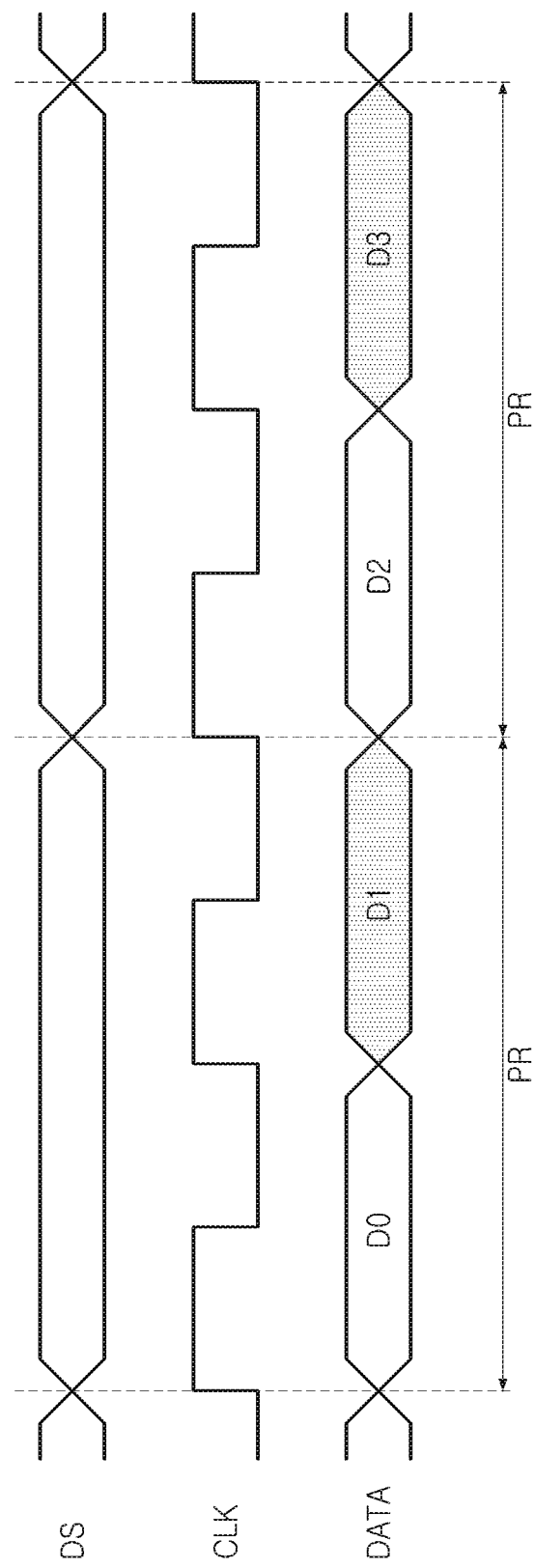
FIGS. 10 and 11 are diagrams illustrating operations of the semiconductor device illustrated in FIG. 9.
Figure 11:
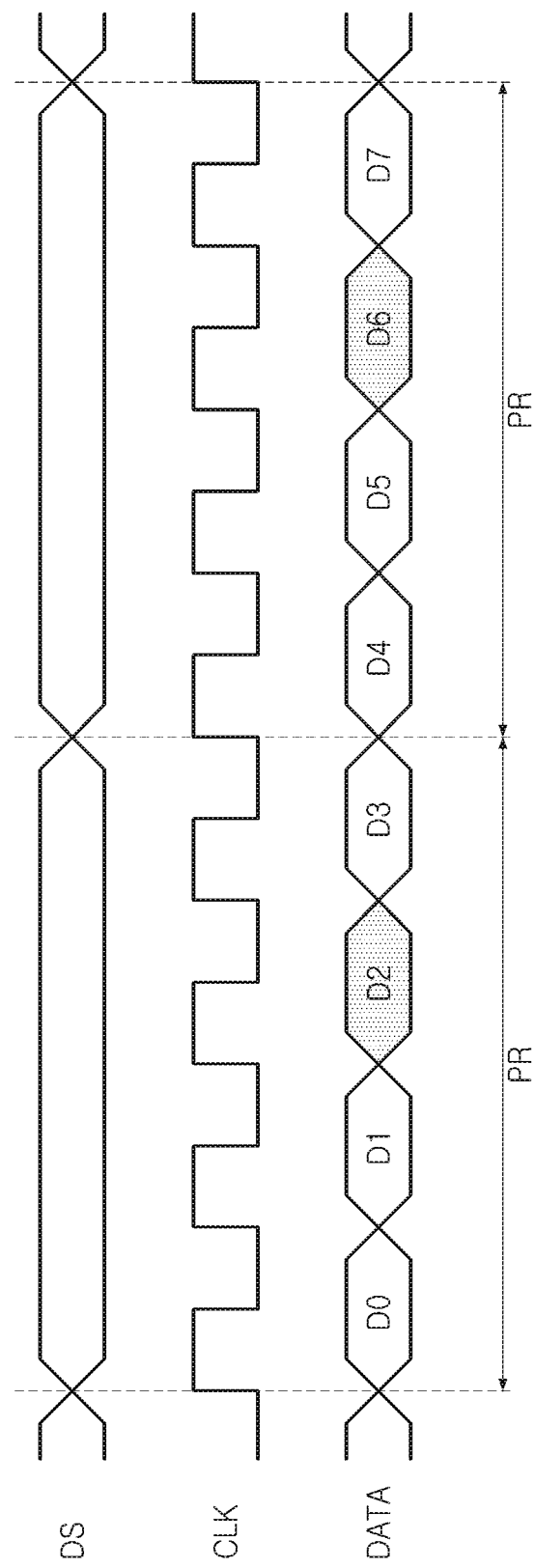

FIGS. 10 and 11 are diagrams illustrating operations of the semiconductor device illustrated in FIG. 9.

FIGS. 10 and 11 may be diagrams illustrating an operation of the data sampler 112. Referring to FIG. 10, the data sampler 112 may receive a data signal DS and a clock signal CLK to output data DATA. The frequency of the clock signal CLK is equal to twice the frequency of the data signal DS, so that the data sampler 112 may output first data D0 and D2 and the second data D1 and D3 at each unit interval PR.

However, as illustrated in FIG. 10, the first data D0 and D2 obtained by sampling the data signal DS by the data sampler 112 at a first rising edge of the clock signal CLK may be a result obtained by sampling an edge of the data signal DS within a single unit interval PR. On the other hand, the second data D1 and D3 obtained by sampling the data signal DS by the data sampler 112 at a second rising edge of the clock signal CLK may be a result obtained by sampling the data signal DS an intermediate point in time within a single unit interval PR. Accordingly, in some example embodiments, the data sampler 112 may output only the second data D1 and D3 to the controller 114 while ignoring the first data D0 and D2. The controller 114 may determine or directly determine the second data D1 and D3 to be data DATA, received at each unit interval, without an unnecessary or an undesirable operation such as an operation of comparing the first data D0 and D2 and the second data D1 and D3 with each other.

Referring to FIG. 11, the frequency of the clock signal CLK is equal to four times the frequency of the data signal DS, so that the data sampler 112 may output first data D0 and D4, second data D1 and D5, third data D2 and D6, and fourth data D3 and D7 at each unit interval PR of the data signal DS.

As illustrated in FIG. 11, the clock signal CLK may have four rising edges at each unit interval PR of the data signal DS. Accordingly, there is a need to an operation of selecting one of the first data D0 and D4, the second data D1 and D5, the third data D2 and D6, and the fourth data D3 D7 output by the data sampler 112 at each unit interval PR.

In some example embodiments, the data sampler 112 may select the third data D2 and D6, among the first data D0 and D4, the second data D1 and D5, and the third data D2 and D6, and the fourth data D3 and D7, and may output the selected third data D2 and D6 to the controller 114. The controller 114 may determine the third data D2 and D6 to be data DATA without an additional comparison operation, and may output the determined third data D2 and D6 to the EOM circuit 121, or the like. This may be because a point in time, at which the third data D2 and D6 are sampled, is close or closest to an intermediate point in time of the unit interval PR.

As described with reference to FIGS. 10 and 11, in the semiconductor device 100 according to an exemplary embodiment, the data sampler 112 may sample the data signal DS with a clock signal CLK having a frequency, greater than a frequency of the data signal DS, and may select data sampled at the point in time closest to the intermediate point in time of the unit interval PR and may output the selected data. Accordingly, time required for the controller 114 to receive the data DATA from the data sampler 112 may be reduced.

Figure 12:
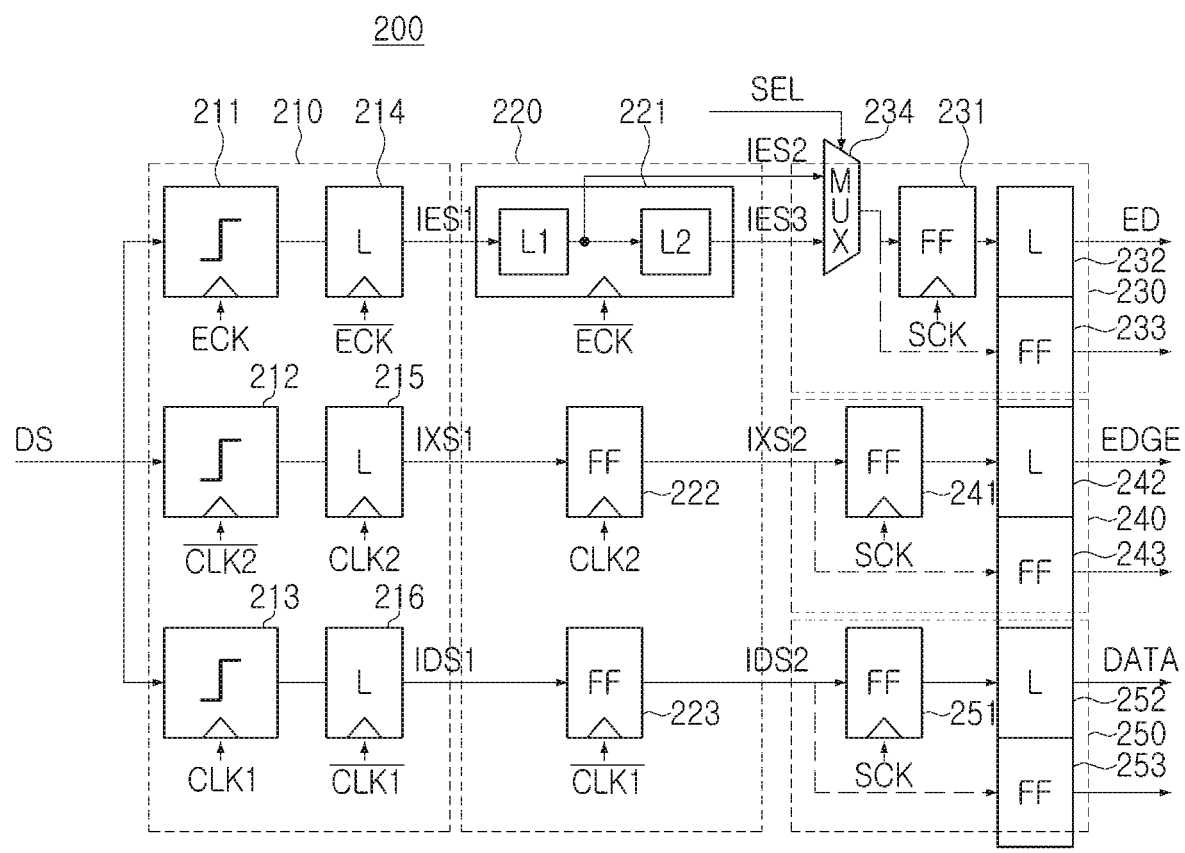
FIG. 12 is a schematic block diagram of a semiconductor device according to some example embodiments.

FIG. 12 is a schematic block diagram of a semiconductor device according to some example embodiments.

Referring to FIG. 12, a semiconductor device 200 according to some example embodiments may include a sampling circuit 210, a retiming circuit 220, and select circuits 230 to 250. The sampling circuit 210 may include slicers 211 to 213 and latches 214 to 216. The sampling circuit 210 may receive a plurality of clock signals CLK1, CLK2, and ECK. As an example, the first clock signal CLK1 and the second clock signal CLK2 may have opposite phases (e.g. be 180 degrees out of phase with each other), and the error clock signal ECK may be a predetermined or dynamically determined phase difference from the first clock signal CLK1 or the second clock signal CLK2.

As an example, the first clock signal CLK1 may be a signal for sampling data transmitted as the data signal DS, and the second clock signal CLK2 may be a signal for sampling edge information, a boundary between symbols of the data signal DS. The first clock signal CLK1, the second clock signal CLK2, and the error clock signal ECK may have the same frequency.

Each of the slicers 211 to 213 may receive one of the clock signals ECK, CLK1, and CLK2 and the data signal DS, and may compare the data signal DS with the reference voltage at the rising edges of the clock signals ECK, CLK1, and CLK2. As an example, when the data signal DS is greater than the reference voltage at the rising edges of the clock signals ECK, CLK1, and CLK2, a logic-high signal may be output, and when the data signal DS is less than the reference voltage at the rising edges of the clock signals ECK, CLK1, and CLK2, a logic-low signal may be output.

Each of the latches 214 to 216 may latch an output of each of the slicers 211 to 213 in response to one of the clock signals ECK, CLK1, and CLK2. Referring to FIG. 12, the first sampling latch 214 may output a first error signal IES1, and the second sampling latch 215 may output a first edge signal IXS1. The third sampling latch 216 may output a first data signal IDS1.

The retiming circuit 220 may adjust timing of each of the signals IES1, IXS1, and IDS1 output from the sampling circuit 210. As an example, the retiming circuit 220 may include a plurality of flip-flops 221 to 223. The first error flip-flop 221 may include a first error latch L1 and a second error latch L2, and may operate in synchronization with a rising edge of the error clock signal ECK. As an example, the first error latch L1 may latch the first error signal IES1 in a rising edge of an error clock signal ECK1 to output a second error signal IES2. The second error latch L2 may latch a second error signal IES2 in a rising edge of an error clock signal ECK2 to output a third error signal IES3. Accordingly, the second error signal IES2 and the third error signal IES3 may have different phases.

The first edge flip-flop 222 may sample the first edge signal IXS1 to output a second edge signal ISX2, and may operate in synchronization with the second clock signal CLK2. The first data flip-flop 223 may operate in synchronization with a complementary signal of the first clock signal CLK1, and may sample the first data signal IDS1 to output a second data signal IDS2.

The select circuits 230 to 250, connected to the retiming circuit 220, may receive a sampling clock signal SCK to operate. The sampling clock signal SCK may have a frequency, lower than a frequency of each of the clock signals ECK, CLK1, and CLK2 input to the sampling circuit 210. As an example, a period of the sampling clock signal SCK may be equal to a unit interval of the data signal DS. The selection circuits 230 to 250 may operate as deserializers.

The error selection circuit 230 may include a second error flip-flop 231, an error output latch 232, an error output flip-flop 233, and a multiplexer 234. The multiplexer 234 may receive the second error signal IES2 and the third error signal IES3, and may transmit one of the second error signal IES2 and the third error signal IES3 based on an additional select signal SEL. An output of the multiplexer 234 may be input to the second error flip-flop 231 or may be input to the error output flip-flop 233. Accordingly, error data ED included in the second error signal IES2 or the third error signal IES3 input to the error select circuit 230 may be deserialized to be output by the error output latch 232 and the error output flip-flop 233.

The edge select circuit 240 may include a second edge flip-flop 241, an edge output latch 242, an edge output flip-flop 243, and the like. Except for the multiplexer 234, an operation of the edge select circuit 240 may be similar to that of the error select circuit 230. The second edge signal IXS1 may be sampled by the second edge flip-flop 241 or sampled by the edge output flip-flop 243 at each rising or falling edge of the sampling clock signal SCK.

An operation of the data select circuit 250 may be similar to that of the edge select circuit 240. The data select circuit 250 may include a second data flip-flop 251, a data output latch 252, and a data output flip-flop 253. The second data signal IDS2 may be input to the second data flip-flop 251 or may be directly input to the data output flip-flop 253. Accordingly, data sampled at different unit intervals may be output at the rising or falling edge of the sampling clock signal SCK.

Figure 13:
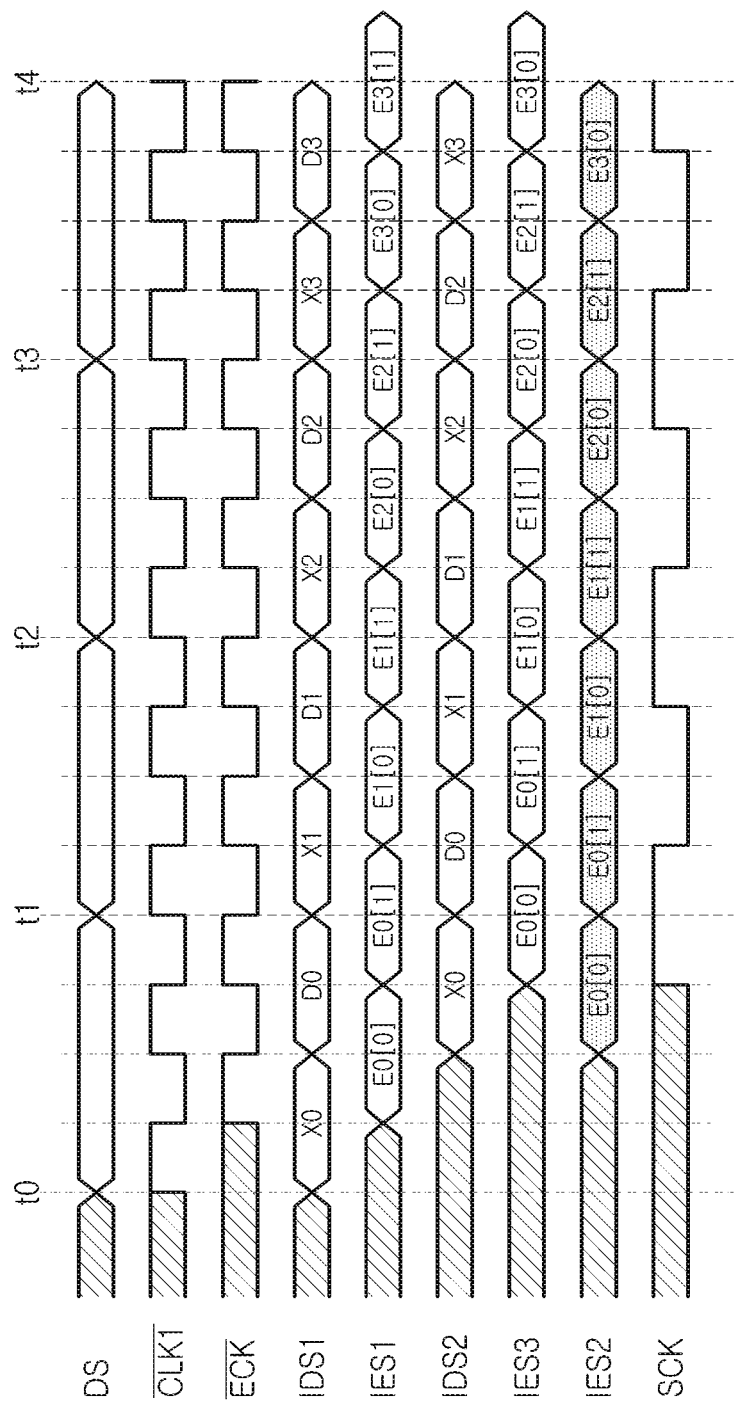
FIGS. 13 and 14 are diagrams illustrating operations of the semiconductor device illustrated in FIG. 12.
Figure 14:
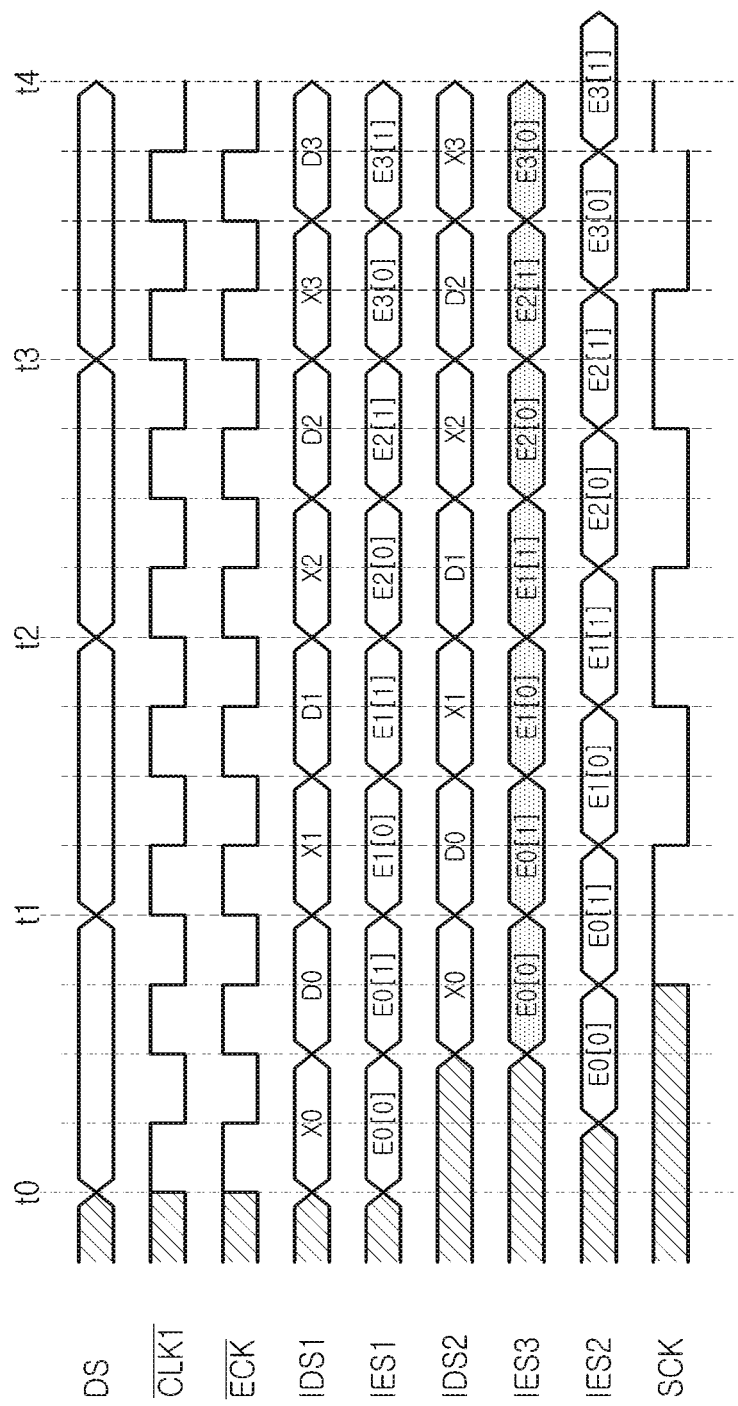

FIGS. 13 and 14 arte diagrams illustrating operations of the semiconductor device illustrated in FIG. 12.

Hereinafter, an operation of the semiconductor device 200 will be described with reference to FIGS. 13 and 14 together with FIG. 12. Referring to FIGS. 13 and 14, the frequency of each of the first clock signal CLK1 and the error clock signal ECK may be higher than the frequency of the data signal DS. In the example embodiment illustrated in FIGS. 13 and 14, the sampling circuit 210 may sample the data signal DS twice per unit interval of the data signal DS.

Referring to FIG. 13 together with FIG. 12, the error clock signal ECK may have a phase difference of 90 degrees from the first clock signal CLK1. The third latch 216 of the sampling circuit 210 may sample the data signal DS at each rising edge of the complementary signal of the first clock signal CLK1. As described above, among a plurality of pieces of data output by sampling the data signal DS twice per unit interval of the data signal DS, first data sampled in advance may be ignored and only the second data sampled later may be selected.

Referring to FIG. 13, the first data signal IDS1 may include a single piece of first data XO to X3 and a single piece of second data D0 to D3 for each unit interval of the data signal DS. As an example, the first data XO to X3 may be edge data, and the second data D0 to D3 may be actual data to be transmitted as the data signal DS.

The first latch 214 of the sampling circuit 210 may sample the data signal DS at each rising edge of the complementary signal of the error clock signal ECK. The first error signal IES1, output from the first latch 214, may include first error data EO[0] to E3[0] and second error data E1[0] to E1[3]. The first latch 214 may sequentially output one of the first error data EO[0] to E3[0] and one of the second error data E1[0] to E1[3] for each unit interval of the data signal DS.

The second data signal IDS2, output by the first data flip-flop 223, may have a time difference from the first data signal IDS1. As an example, the time difference may correspond to a single period of the first clock signal CK1.

The first edge flip-flop 221 may output a second error signal IES2, sampled with only the first latch L1, and a third error signal IES3 sampled with the first latch L1 and the second latch L2. Since times of sampling are different from each other, the second error signal IES2 and the third error signal IES3 may have different phases. As an example, the second error signal IES2 may have the same phase as the second data signal IDS2, and the third error signal IES3 may have a phase, later than a phase of the second data signal IDS2.

Referring to FIG. 13, a frequency of the sampling clock signal SCK, input to the select circuits 230 to 250, may be equal to ½ times the frequency of the first clock signal CLK1. A phase of the sampling clock signal SCK may be adjusted to a phase optimized or improved for the second data flip-flop 251 to sample the second data signal IDS2 in the data select circuit 250. In various example embodiments illustrated for example in FIG. 13, the second data flip-flop 251 may samples the second data signal IDS2 at a falling edge of the sampling clock signal SCK. Accordingly, the sampling clock signal SCK may be set such that the falling edge thereof is aligned with a center of the second data D0 to D3.

The second error flip-flop 231, included in the error select circuit 230, may sample an output of the multiplexer 234 at a falling edge of the sampling clock signal SCK. In the example embodiment illustrated in FIG. 13, the second error signal IES2 having the same phase as the second data signal IDS2 may be accurately aligned with the sampling clock signal SCK, whereas the third error signal IES3 may not be precisely aligned with the sampling clock signal SCK. As an example, the falling edge of the sampling clock signal SCK may be aligned with an edge of the third error signal IES3.

Accordingly, the select signal SEL input to the multiplexer 244 may control the multiplexer 234 to select the second error signal IES2, rather than the third error signal IES3. The error select circuit 230 may output the second error signal IES2, and the EOM circuit may compare the second error signal IES2 with the second data signal IDS2 to generate an eye diagram of the data signal DS.

Referring to FIGS. 14 and 12 together, the error clock signal ECK may have a phase difference of 0 degrees with the first clock signal CLK1. The third latch 216 of the sampling circuit 210 may sample the data signal DS at each rising edge of the complementary signal of the first clock signal CLK1, and may sample and output the data signal DS twice for each unit interval of the data signal DS.

Referring to FIG. 13, the first data signal IDS1 may include a single piece of first data XO to X3 and a single piece of second data D0 to D3 for each unit interval of the data signal DS. As an example, the first data XO to X3 may be edge data, and the second data D0 to D3 may be actual data to be transmitted as the data signal DS.

The first latch 214 of the sampling circuit 210 may sample the data signal DS at each rising edge of the complementary signal of the error clock signal ECK to output the first error signal IES1. The first error signal IES1 may include first error data EO[0] to E3[0] and second error data E1[0] to E1[3]. The first latch 214 may sequentially output one of the first error data EO[0] to E3[0] and one of the second error data E1[0] to E1[3] at each unit interval of the data signal DS.

The second data signal IDS2, output from the first data flip-flop 223, may have a time difference corresponding to a single period of the first data signal IDS1 and the first clock signal CK1. The first edge flip-flop 221 may output a second error signal IES2, sampled by only the first latch L1, and a third error signal IES3 sampled by the first latch L1 and the second latch L2. Since times of sampling are different from each other, the second error signal IES2 and the third error signal IES3 may have different phases. As an example, the second error signal IES2 may have a phase, later than the second data signal IDS2, and the third error signal IES3 may have the same phase as the second data signal IDS2.

Similarly to the example embodiment illustrated in FIG. 13, a frequency of the sampling clock signal SCK may be equal to ½ times the frequency of the first clock signal CLK1. The sampling clock signal SCK may have a phase optimized or improved for the second data flip-flop 251 to sample the second data signal IDS2. The second data flip-flop 251 may sample the second data signal IDS2 at a falling edge of the sampling clock signal SCK, and the sample clock signal SCK may be set such that a falling edge thereof is aligned with a center of the second data D0 to D3.

The second error flip-flop 231 included in the error select circuit 230 may sample the output of the multiplexer 234 at the falling edge of the sampling clock signal SCK. The third error signal IES3 having the same phase as the second data signal IDS2 may be accurately aligned with the falling edge of the sampling clock signal SCK, whereas an edge of the second error signal IES2 may be aligned with the falling edge of the sampling clock signal SCK.

Accordingly, the select signal SEL may control the multiplexer 234 to select a third error signal IES3. The error select circuit 230 may output the third error signal IES3, and the EOM circuit may compare the third error signal IES3 with the second data signal IDS2 to generate an eye diagram of the data signal DS.

Figure 15:
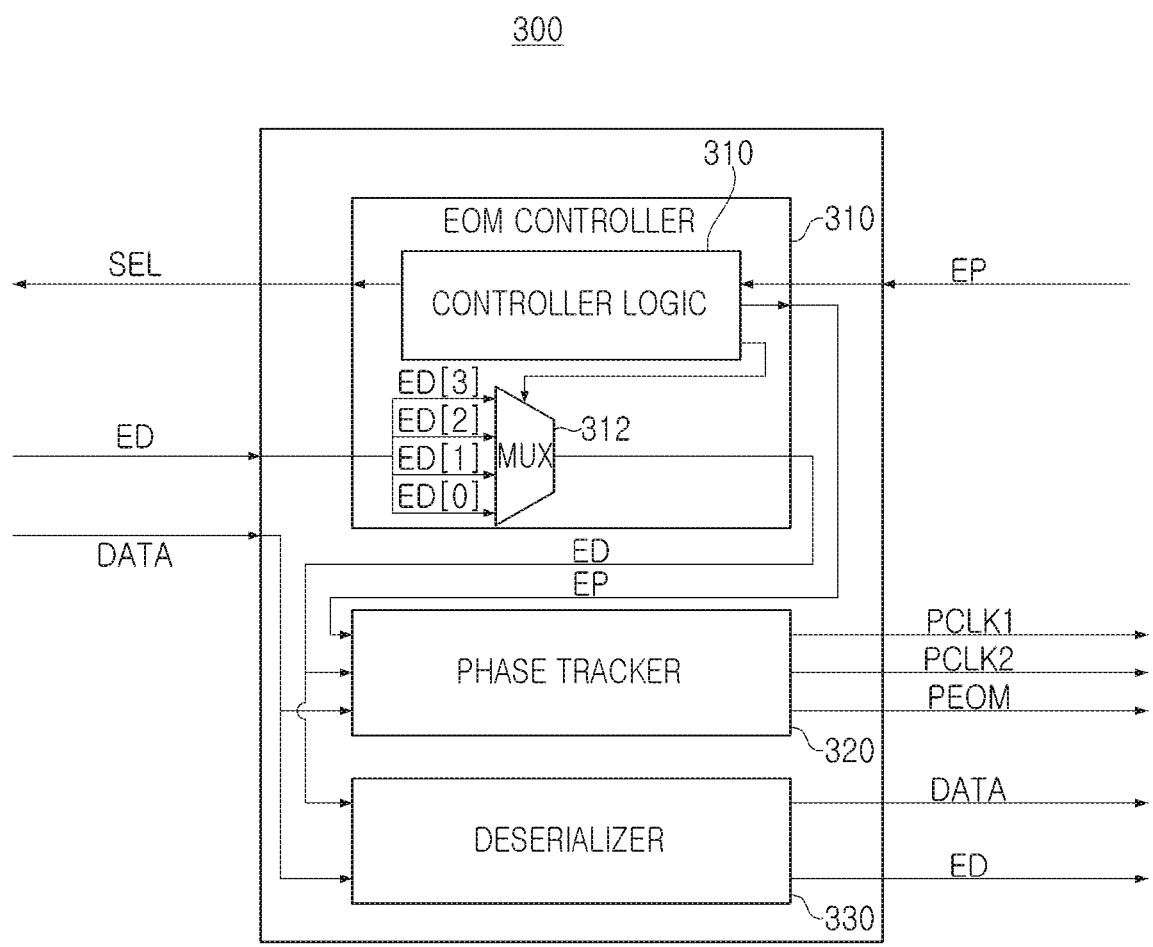
FIG. 15 is a schematic block diagram of a semiconductor device according to some example embodiments.

FIG. 15 is a schematic block diagram of a semiconductor device according to some example embodiments.

FIG. 15 may be a schematic block diagram illustrating a controller 300 included in the semiconductor device according to some example embodiments. The controller 300 may include an EOM controller 310, a phase tracker 320, and a deserializer 330.

The EOM controller 310 may include a control logic 311, a multiplexer 312, and the like. The control logic 311 may receive error phase information EP from the EOM circuit 310 included in a digital circuit region. The control logic 311 may select one of a plurality of pieces of error data ED[0] to ED[3] (ED), output by an error sampler, based on the error phase information EP. As an example, the control logic 311 may allow the multiplexer 312 to output one of the plurality of pieces of error data ED to the deserializer 330.

The control logic SEL may output a select signal SEL based on the error phase information EP. As described above with reference to FIGS. 12 to 14, the select signal SEL may be a signal for selecting one of a second error signal IES2 and a third error signal IES3 having different phases. As an example, as described in the embodiment illustrated in FIG. 13, when a phase difference between the clock signal and the error clock signal is determined to be 90 degrees based on the error phase information EP, the control logic 311 may generate and output the select signal SEL for selecting the second error signal IES2.

The phase tracker 320 may receive the error data ED, data DATA, and the error phase information EP. The phase tracker 320 may output a first clock phase PCLK1, a second clock phase PCLK2, an error clock phase PEOM, and the like. An output of the phase tracker 320 may be input to a clock generator supplying clock signals to a sampler. In some example embodiments, the phase tracker 320 may include a clock data recovery (CDR) circuit. The clock generator, receiving the output of the phase tracker 320, may include a phase locked loop circuit, a delay locked loop circuit, and the like.

The deserializer 330 may deserialize the data DATA and the error data ED, and may output the deserialized DATA and ED to the digital circuit region. As an example, the data DATA and the error data ED may be input to the EOM circuit in the digital circuit region, and the EOM circuit may compare the data DATA with the error data ED to generate an eye diagram of a data signal input to an analog circuit region.

As described above, an error sampler may sample the data signal in synchronization with the error clock signal having a frequency, higher than a frequency of a data signal, to output a plurality of pieces of error data ED for each unit interval of the data signal. When a rising edge or a falling edge of an error clock signal is included N times per unit interval of the data signal, the error sampler may output N pieces of error data ED.

The EOM circuit may selectively receive one of the plurality of pieces of error data ED and may compare the selected error ED data with the data DATA sampled by the data sampler. As an example, when receiving the second error data ED[1] from the controller 300, the EOM circuit may generate an eye diagram of the data signal at a time at which the second error data ED[1] is output. As described above, each of the plurality of pieces of error data ED may be received and compared with the data DATA to draw an eye diagram of the data signal for an entire unit interval.

The EOM circuit compares error data ED selected by the multiplexer 312 and output by the deserializer 330, among the plurality of pieces of error data ED, and the data DATA, output by the data sampler, with each other $2^n$ times, where n may be a positive integer. Each of the error sampler and the data sampler may sample the data signal $2^n$ times and transmit the sample data signal to the controller 300. The EOM circuit may compare the data DATA with the error data ED to generate an eye diagram based on the number of times the data DATA and the error data ED match each other and the number of times of the data DATA and the error data ED mismatch other. As an example, when the number of times the data DATA and the error data ED match each other is the same as the number of comparisons of $2^n$ times, the eye diagram may have a maximum height. On the other hand, when the number of times the data DATA and the error data ED match each other is only half the number of comparisons of $2^n$ times, a height of the eye diagram may be reduced by half. When the data DATA and the error data ED do not match in all of the comparisons of $2^n$ times, the eye diagram may be closed.

Figure 16:
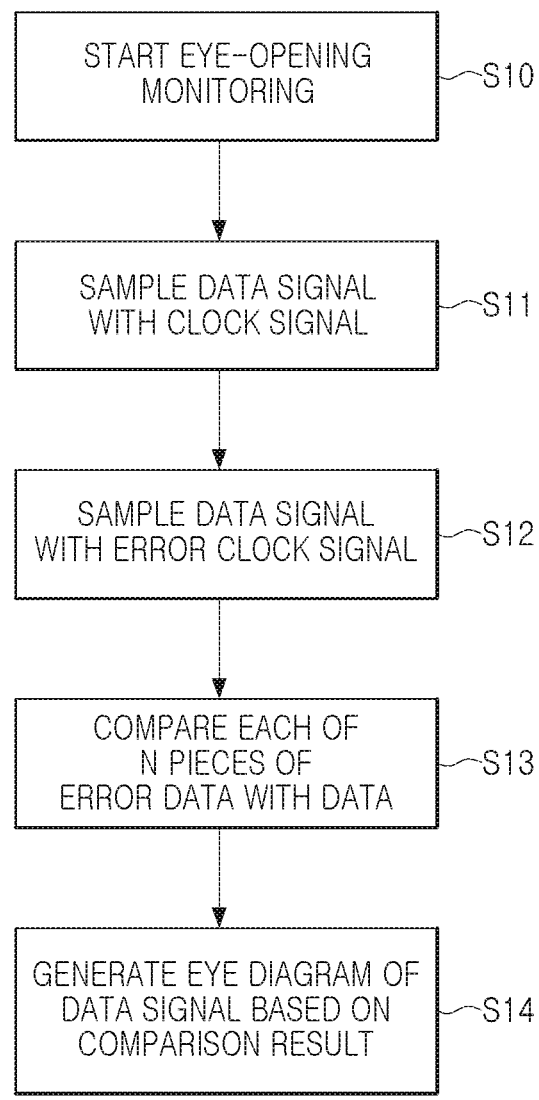
FIGS. 16 to 18 are flowcharts illustrating operations of a semiconductor device according to some example embodiments.
Figure 17:
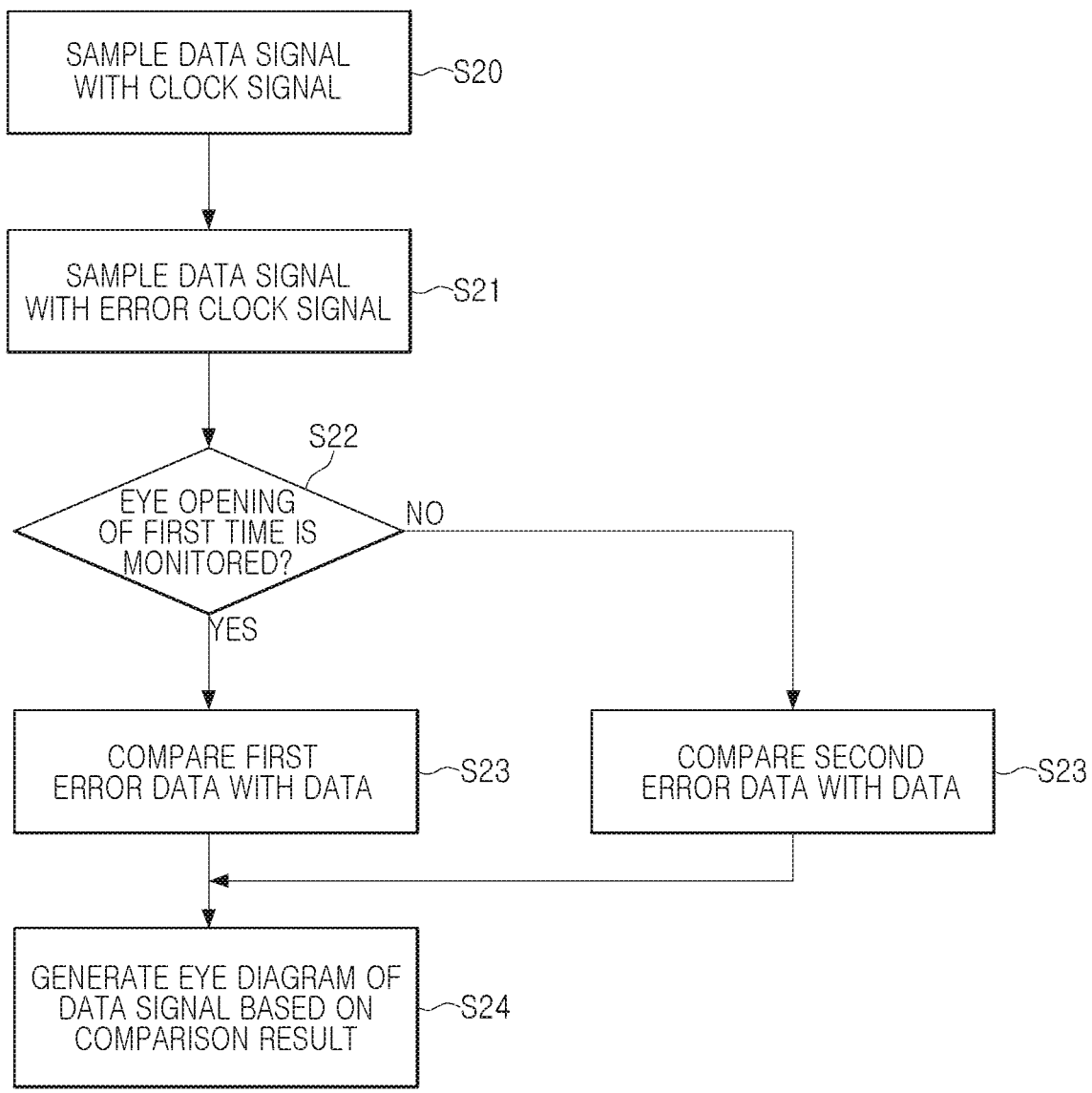
Figure 18:
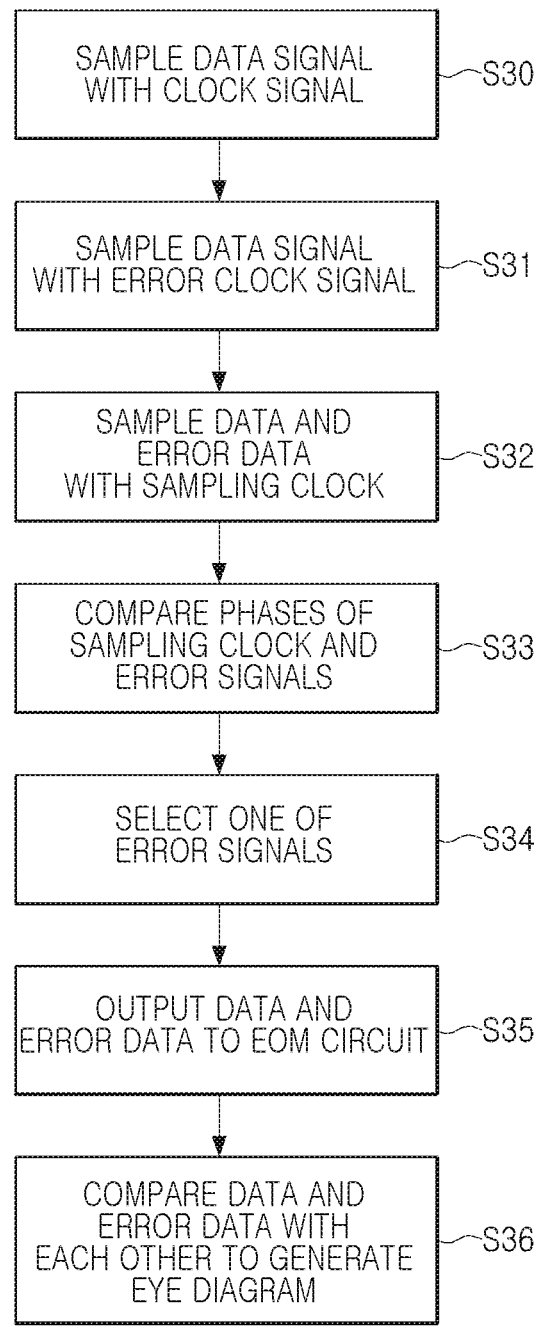

FIGS. 16 to 18 are flowcharts illustrating operations of a semiconductor device according to some example embodiments.

Referring to FIG. 16, in operation S10, the semiconductor device according to some example embodiments may start eye-opening monitoring. The eye-opening monitoring may be an operation of confirming how an eye diagram of a data signal appears when a data sampler samples the data signal, using a currently set reference voltage and clock signal. Accordingly, when the eye opening monitoring is started, the semiconductor device may perform operations of generating an eye diagram of the data signal.

In operation S11, the semiconductor device may sample a data signal with a clock signal. The data signal may be a signal received from another external semiconductor device, and the clock signal may be a signal generated in the semiconductor device. In operation S12, the semiconductor device may sample the data signal with an error clock signal. The error clock signal may be a signal having the same frequency as the clock signal and a phase, different from that of the clock signal. The semiconductor device may include a data sampler, sampling the data signal in synchronization with the clock signal, and an error sampler sampling the data signal in synchronization with the error clock signal. The data sampler and the error sampler may simultaneously sample the data signal.

The clock signal and the error clock signal may have a frequency, higher than a transmission frequency of the data signal. Accordingly, the data sampler and the error sampler may generate and output a plurality of pieces of data and a plurality of pieces of error data for each unit interval of the data signal. In operation S13, an EOM circuit connected to the data sampler and the error sampler may compare data corresponding to actual data, among the plurality of pieces of data, with each of N pieces of error data.

As an example, the error clock signal may have N rising edges per unit interval of the data signal, so that the error sampler may sequentially output N pieces of error data per unit interval of the data signal. The EOM circuit may receive error data of a specific order, among the N pieces of error data, a plurality of times for a predetermined and/or dynamically determined time and may compare the received error data with data sampled by the data sampler to generate an eye diagram corresponding to a portion of the unit interval.

For example, when the error sampler sequentially outputs four pieces of error data for each unit interval of the data signal, the EOM circuit may receive first error data for a predetermined and/or dynamically determined time and may compare the received first error data with data received for the same time. In the case in which M pieces of error data and M pieces of data are input to the EOM circuit for the predetermined and/or dynamically determined time, the EOM circuit may determine the number of times the error data and data match each other based on a result of comparisons of N times and may obtain information required to generate an eye diagram of a data signal corresponding to a first time in a single unit interval divided into first to times.

The EOM circuit may change a phase of the error clock signal, input to the error sampler, and a magnitude of a reference voltage, commonly input to the data sampler, and may repeatedly perform the above operation to generate an eye diagram of the data signal corresponding to the first time. As a result, in operation S14, the EOM circuit may obtain the eye diagram of the data signal by comparing the data, output by the data sample, with the error data, output by the error sampler, while changing the phase of the error clock signal and the magnitude of the reference voltage.

Referring to FIG. 17, the operation of the semiconductor device according to some example embodiments may start with operation S20, in which data signal is sampled with a clock signal, and operation S21 in which the data signal is sampled with an error clock signal. The semiconductor device may include a data sampler and an error sampler receiving a data signal at the same time. The data sampler may sample the data signal at each rising or falling edge of the clock signal, and the error sampler may sample the data signal at each rising or falling edge of the error clock signal. The error clock signal may have a predetermined and/or dynamically determined phase difference from the clock signal, so that an output of the error sampler may be different from an output of the data sampler.

The semiconductor device according to some example embodiments may operate in an oversampling manner, and a transmission frequency of a data signal may be lower than a frequency of each of a clock signal and an error clock signal. Accordingly, simple comparison between the data output by the data sampler with the error data output by the error sampler may result in inaccurate generation of an eye diagram of the data signal in a single unit interval.

In some example embodiments, comparison between the data output by the data sampler with each of a plurality of pieces of error data output by the error sampler may result in accurate generation of an eye diagram of a data signal in a single unit interval. For example, when a frequency of each of the clock signal and the error clock signal is equal to twice a transmission frequency of the data signal, the error sampler may sequentially sample first error data and second error data for the same time as a single unit interval.

The EOM circuit, generating the eye diagram of the data signal, may divide a single unit interval into a first time in a first half and a second time in a second half. In operation S22, the EOM circuit may determine whether time required to monitor current eye opening is the first time, to generate an eye diagram. When monitoring the eye opening of the first time, the EOM circuit may receive the data from the data sampler and may selectively receive the first error data, among the first error data and the second error data output by the error sample. In operation S23, the EOM circuit may compare the first error data and the data with each other. In operation S25, the EOM circuit may generate an eye diagram of the data signal in the first time based on a comparison result.

When monitoring eye opening of a second time subsequent to the first time, the EOM circuit may receive the data from the data sampler and may selectively receive the second error data, among the first error data and the second error data output by the error sampler. In operation S24, the EOM circuit may compare the data with the second error data. In operation S25, the EOM circuit may generate an eye diagram of the data signal in the second time based on the comparison result. The EOM circuit may combine the eye diagrams, generated in the first time and the second time, to obtain the eye diagram of the data signal in a single unit interval.

Referring to FIG. 18, an operation of the semiconductor device according to some example embodiments may start with operation S3, in which a data signal is sampled with a clock signal, and operation S31 in which the data signal is sampled with an error clock signal. A data sampler and an error sampler of the semiconductor device may simultaneously receive and sample the data signal. The data sampler may sample the data signal based on the clock signal, and the error sampler may sample the data signal based on the error clock signal. The error clock signal may have a predetermined and/or dynamically determined phase difference from the clock signal. In some cases, an output of the error sampler may be the same as or different from an output of the data sampler.

The semiconductor device according to some example embodiments may operate in an oversampling manner, and a frequency of each of the clock signal and the error clock signal may be higher than a transmission frequency of the data signal. Data, output after sampling the data signal by the data sampler, and error data, output after sampling the data signal by the error sampler, may be transmitted to the EOM circuit generating an eye diagram.

In operation S32, the data and the error data may be sampled with a clock signal and a sampling clock having a frequency, lower than the error clock signal. As an example, a sampling clock may be input to a deserializer connected to output terminals of the data sampler and the error sampler. In this case, as described with reference to FIG. 12, the error data may be output as error signals adjusted to have different phases by a latch. The error signals may include the same error data, but may have different phases.

In operation S33, the semiconductor device may compare each of the error signals, including the error data, with the sampling clock to determine a phase difference. In operation S34, the semiconductor device may select one of the error signals based on the phase difference. For example, among the error signals, a single error signal having a phase optimized or improved to be sampled with a rising or falling edge of the sampling clock may be selected. The selected error signal may be output to the EOM circuit. Accordingly, in operation S35, the data and the error data may be output to the EOM circuit.

In operation S36, the EOM circuit may compare the data and the error data with each other to generate an eye diagram. However, as described above with reference to FIG. 17, only an eye diagram for a portion of the unit interval of the data signal may be obtained as a result of comparing the data and the error data with each other. As an example, when a frequency of the clock signal is equal to four times a transmission frequency of the data signal, only an eye diagram at ¼ time of the unit interval may be obtained by simply comparing the data and the error data with each other. Therefore, according to some example embodiments, an eye diagram may be accurately generated in a single unit interval by comparing each of a plurality of pieces of error data, output by the error sampler, with the data for a time corresponding to the single unit interval.

Figure 19:
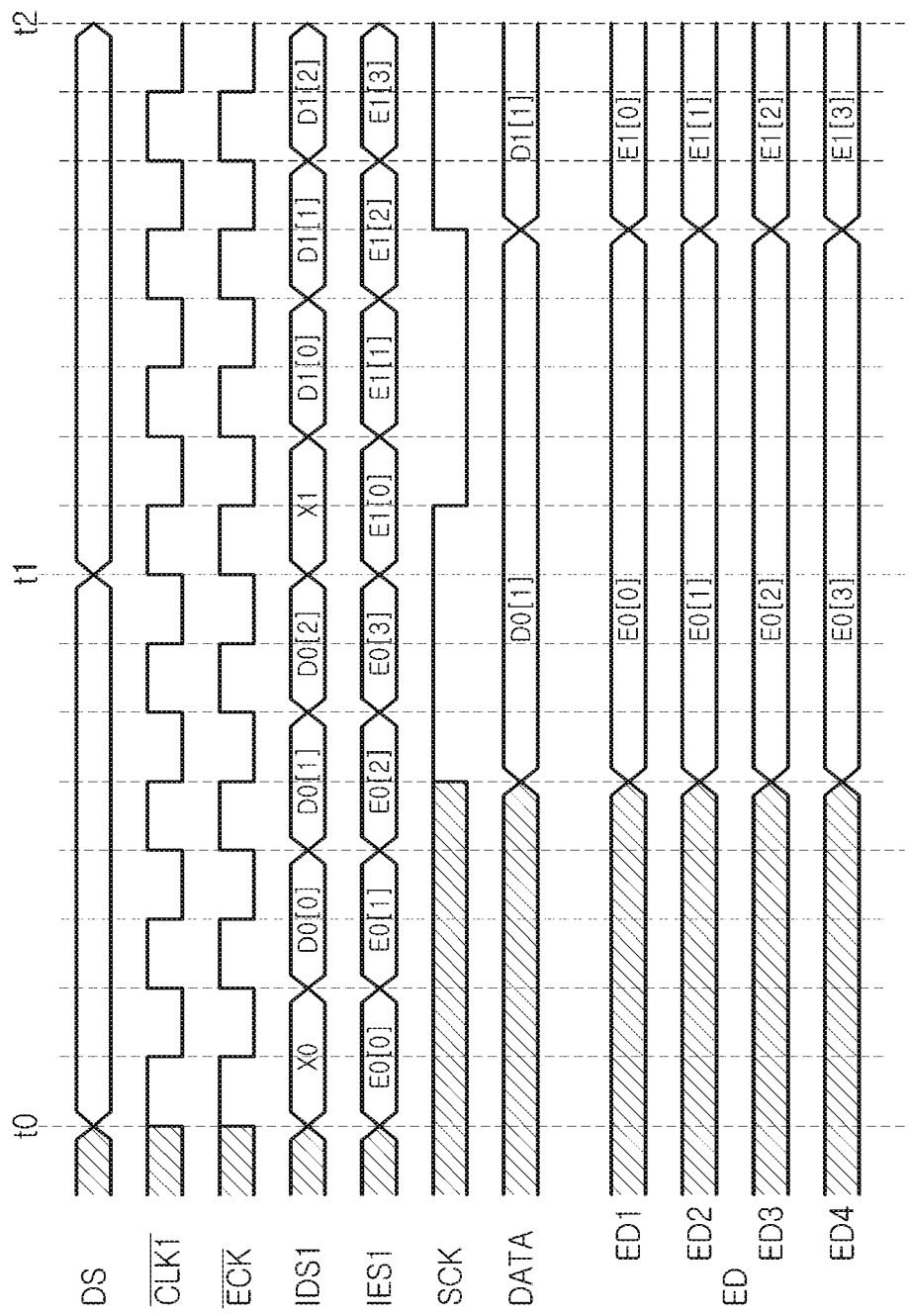
FIGS. 19 and 20 are diagrams illustrating operations of a semiconductor device according to some example embodiments.
Figure 20:
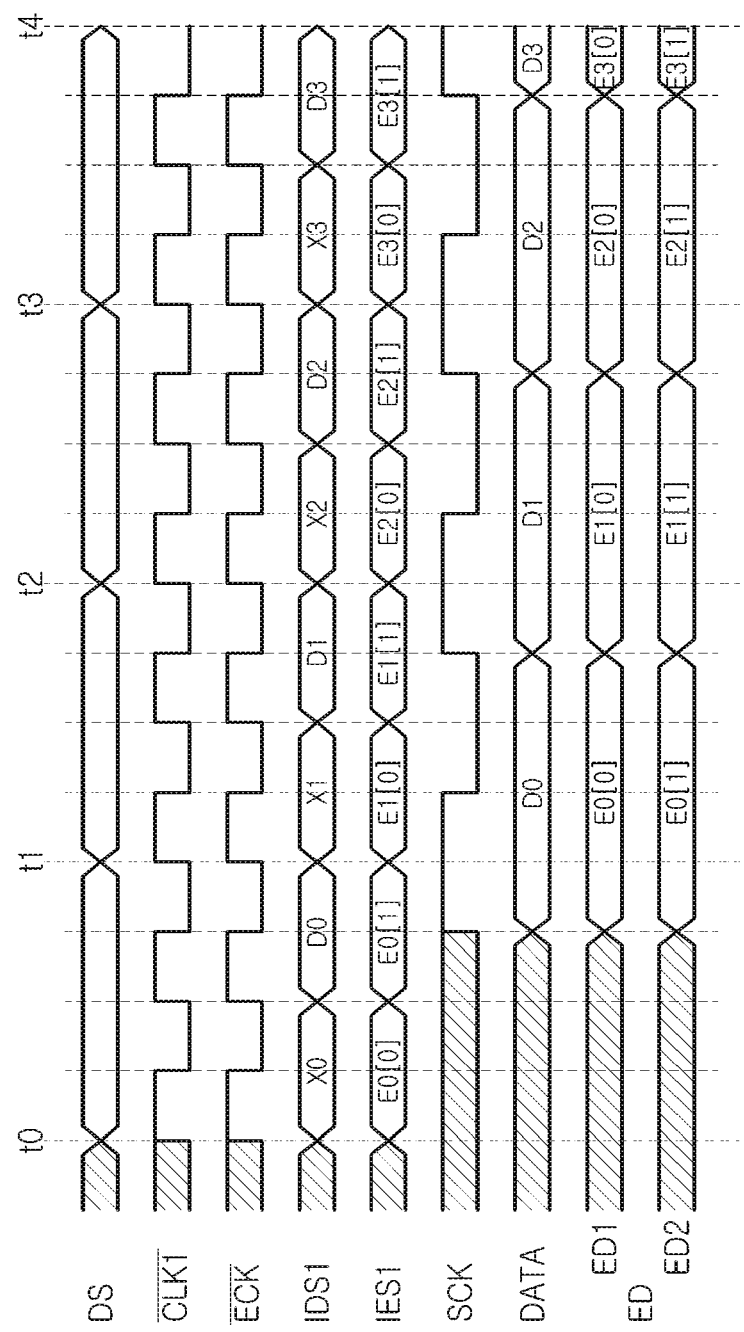

FIGS. 19 and 20 are diagrams illustrating operations of a semiconductor device according to some example embodiments.

FIG. 19 may be a diagram illustrating an operation of a semiconductor device in some example embodiments in which a frequency of a first clock signal CLK1, input to a data sampler, is equal to four times a transmission frequency of a data signal DS. Referring to FIG. 19, a complementary signal of the first clock signal CLK1 and a complementary signal of an error clock signal ECK are illustrated, and a frequency of each of the two clock signals may be equal to four times the transmission frequency of the data signal DS.

A first data signal IDS1 may be an output of the data sampler, and a first error signal IES1 may be an output of the error sampler. The data sampler may sample the data signal DS four times during a unit interval of the data signal DS to output a plurality of pieces of data. As an example, the data sampler may sequentially output first data XO, second data D0[0], third data D0W), and fourth data D0[2] during a unit interval between a first point in time t0 and a second point in time t1. Similarly, the data sampler may sequentially output first data Xl, second data D1[0], third data D1[1], and fourth data D1[2] during a unit interval between the second point in time t1 and a third point in time t2.

Similarly to the data sampler, the error sampler may also sample the data signal DS four times during a unit interval of the data signal DS to output error data. For example, the error sampler may sequentially output first error data E0[0], second error data EOM, third error data E0[2], and fourth error data E0[3] during a unit interval between the first point in time t0 and the second point in timet1. The error sampler may sequentially output first error data E1[0], second error data E1 [1], third error data E1[2], and fourth error data E1 [3] during a unit interval between the second point in time t1 and the third point in timet2.

The sampling clock SCK may be input to a deserializer connected to the data sampler and the error sampler and may have a frequency, lower than a frequency of the first clock signal CLK1. The first data signal IDS1 and the first error signal IES1 may be converted into data DATA and error data ED, relatively slow signals, by the deserializer and then output to a controller between a sampler and an EOM circuit, respectively.

Referring to FIG. 19, error data ED may include first error data ED1 output first, second error data ED2 output second, third error data ED3 output third, and fourth error data ED4 output last at each unit interval. A controller may collect the data DATA and the error data ED by a predetermined and/or dynamically determined size and output the collected DATA and ED to the EOM circuit. In this case, the controller may select one of the first error data ED1 to the fourth error data ED4 and output the selected data to the EOM circuit in response to the control from the EOM circuit.

When the data DATA and the first error data ED1 are output to the EOM circuit, the EOM circuit may generate an eye diagram of the data signal DS corresponding to a first quarter time of a single unit interval. When the data DATA and the second error data ED2 are output to the EOM circuit, the EOM circuit may generate an eye diagram of the data signal DS corresponding to a second quarter time of the single unit interval. The EOM circuit, receiving the data DATA and the third error data ED3, may generate an eye diagram of the data signal DS corresponding to a third quarter time of the single unit interval. The EOM circuit, receiving the data DATA and the fourth error data ED4, may generate an eye diagram of the data signal DS corresponding to a last quarter time of the single unit interval.

FIG. 20 may be a diagram illustrating an operation of a semiconductor device in some example embodiments in which a frequency of a first clock signal CLK1, input to a data sampler, is equal to twice a transmission frequency of a data signal DS. Referring to FIG. 20, a complementary signal of the first clock signal CLK1 and a complementary signal of the error clock signal ECK are illustrated. Each of the two clock signals may have two rising edges within a single unit interval of the data signal DS.

The data sampler may sample the data signal DS to output a first data signal IDS1, and the error sampler may sample the data signal DS to output a first error signal IES1. The data sampler may sample the data signal DS twice during a unit interval of the data signal DS to output a plurality of pieces of data. For example, the data sampler may sequentially output first data XO and the second data D0 during a unit interval between a first point in time t0 and a second point in time t1.

The error sampler may also sample the data signal DS twice during a unit interval of the data signal DS to output error data. For example, the error sampler may sequentially output first error data E0[0] and second error data EOM during the unit interval between the first point in time t0 and the second point in time t1.

The sampling clock SCK may be a clock input to a deserializer connected to the data sampler and the error sampler and may have a frequency, lower than a frequency of the first clock signal CLK1. The first data signal IDS1 and the first error signal IES1 may be respectively converted into data DATA and error data ED, relatively slow signals, by the deserializer and may then be output to the controller between the sampler and the EOM circuit. As an example, the data DATA and the error data ED may have the same frequency as the data signal DS.

Referring to FIG. 20, the error data ED may include first error data ED1 output first and second error data ED2 output second at each unit interval. The controller may collect the data DATA and the error data ED by a predetermined and/or dynamically determined size and output the collected DATA and ED to the EOM circuit. The controller may output only one of the first error data ED1 and the second error data ED2 to the EOM circuit in response to the control from the EOM circuit.

When the data DATA and the first error data ED1 are output to the EOM circuit, the EOM circuit may generate an eye diagram of the data signal DS corresponding to a first half time of a single unit interval. When the data DATA and the second error data ED2 are output to the EOM circuit, the EOM circuit may generate an eye diagram of the data signal DS corresponding to a second half time of the single unit interval.

Figure 21:
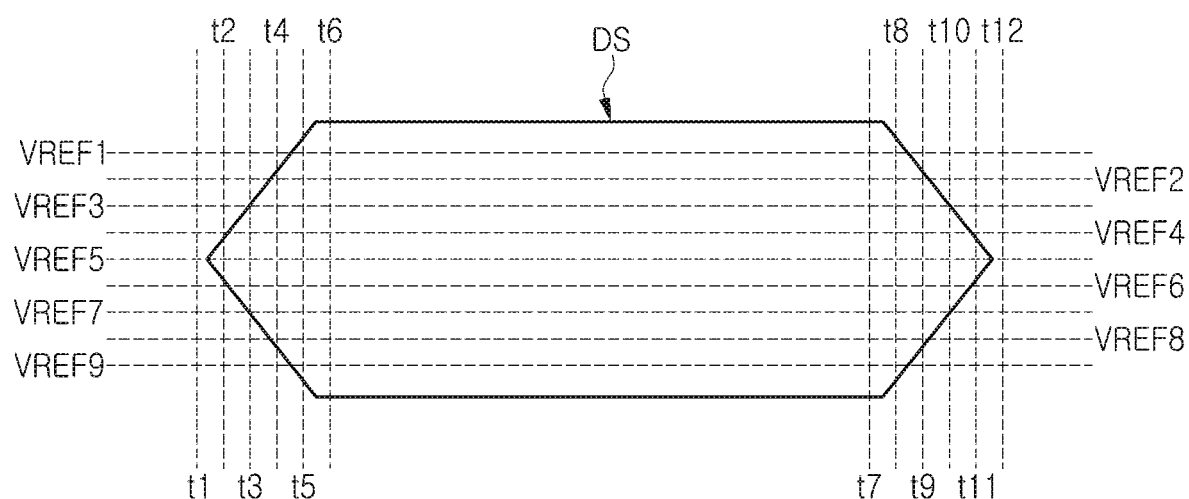
FIG. 21 is a diagram illustrating operations of a semiconductor device according to some example embodiments.

FIG. 21 is a diagram illustrating operations of a semiconductor device according to some example embodiments.

Referring to FIG. 21, a data signal DS is illustrated. An eye diagram of a data signal DS may be more accurately estimated using high and low, or maximum and minimum voltages that the data signal DS may have, and a length of a unit interval.

The semiconductor device according to some example embodiments may operate in an oversampling manner in which a data sampler samples the data signal DS with a clock signal having a frequency, higher than that of the data signal DS. Accordingly, an eye diagram for the entire unit interval may not be generated in a manner in which the data signal is sampled with an error clock signal having a predetermined and/or dynamically determined phase difference from the clock signal to generate error data and the data output by the data sampler is compared with the error data.

As an example, in the case in which the frequency of the clock signal is equal to twice the frequency of the data signal DS, in some example embodiments, first error data may be obtained by sampling an error clock signal with an error clock signal in a first half time of a single unit interval, and second error data may be obtained by sampling a data signal with the error clock signal in a second half time. Each of the first error data and the second error data may be the same as or different from data according to a phase difference between the error clock signal and the clock signal.

Referring to FIG. 21, when an edge of the error clock signal is disposed at a first point in time t1, the first error data may be different from the data and the second error data may be the same as the data. When the edge of the error clock signal is disposed at a second point in time t2, the first error data may be the same as or different from the data. Accordingly, a plurality of piece of first error data, obtained a plurality of times over a larger amount of time than a unit interval, may be compared with data and the number of times the plurality of pieces of error data and the data match each other or do not match each other may be determined. As an example, the number of times the error data and data match each other when the edge of the error clock signal is disposed at a second point in time t2 may be smaller than the number of times the error data and the data may match each other when the edge of the error clock signal is disposed at a third point in time t3. As described above, the smaller the number of times the error data and the data match each other, the less a height of an eye diagram of the data signal at a corresponding point in time.

Similarly, when the edge of the error clock signal is disposed at a seventh point in time t7, most pieces of second error data may match the data. On the other hand, when the edge of the error clock signal is disposed at an eighth point in time t8, some pieces of second error data may not match the data. In some example embodiments, the number of times the error data and the data match each other may be gradually increased as the edge of the error clock signal is disposed to be close to a twelfth point in time t12.

Alternatively or additionally, in some example embodiments, an eye diagram may be estimated by adjusting magnitudes of reference voltages VREF1 to VREF9, commonly input to the data sampler and the error sampler, simultaneously with a phase of the error clock signal. In the case in which the edge of the error clock signal is disposed at a fourth point in time t4, most pieces of error data may match the data when one of the fourth to sixth reference voltages VREF4 to VREF6 is input to the data sampler and the error sampler. On the other hand, some pieces of error data may not match the data when the first reference voltage VREF1 or the ninth reference voltage VREF9 is input to the data sampler and the error sampler. In such a manner, a boundary of the eye diagram may be accurately estimated while fixing the edge of the error clock signal and changing the magnitude of the reference voltage.

Figure 22:
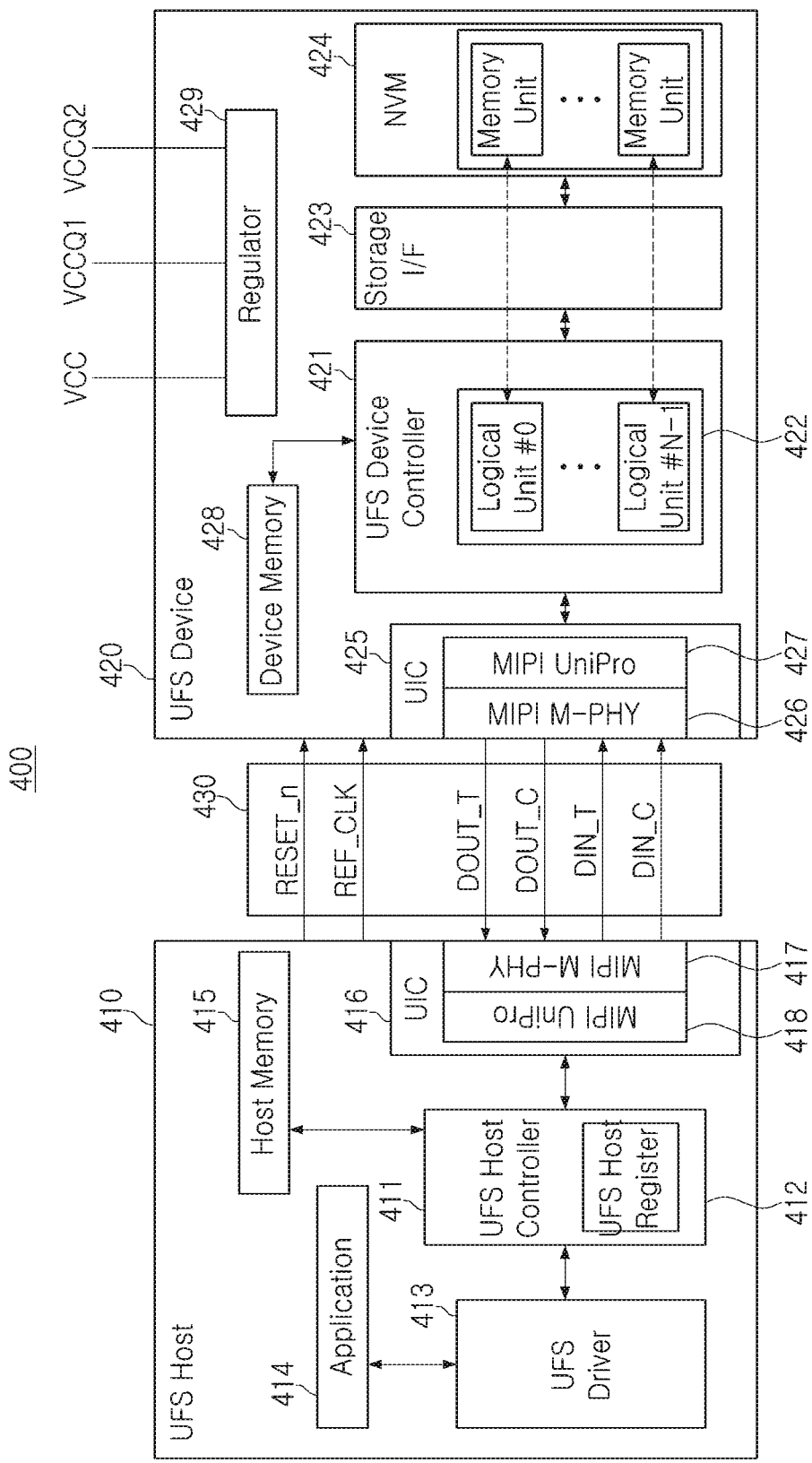
FIG. 22 is a schematic block diagram of a system including a semiconductor device according to some example embodiments.

FIG. 22 is a schematic block diagram of a system including a semiconductor device according to some example embodiments.

FIG. 22 is a diagram illustrating a UFS system 400 according to some example embodiments. The UFS system 400 complies with UFS standards published by Joint Electron Device Engineering Council (JEDEC) and may include a UFS host 410, a UFS device 420, and a UFS interface 430.

Referring to FIG. 23, the UFS host 410 and the UFS device 420 may be connected to each other through the UFS interface 430. In some example embodiments, the UFS host 410 may be implemented as a part of an application processor. The UFS host 410 may include a UFS host controller 411, an application 414, a UFS driver 413, a host memory 415, and a UFS interconnect (UIC) layer 416. The UFS device 420 may include a UFS device controller 421, a nonvolatile memory 424, a storage interface 423, a device memory 428, a UIC layer 425, and a regulator 426. The nonvolatile memory 424 may include a plurality of memory units. The memory units may include vertical NAND (VNAND) flash memory in a two-dimensional (2D) and/or three-dimensional (3D) structure. The UFS device controller 421 and the nonvolatile memory 424 may be connected to each other through the storage interface 423. The storage interface 1230 may be implemented to comply with a standard protocol such as Toggle and/or ONFI.

The application 414 may refer to a program for communicating with the UFS device 420 to use a function of the UFS device 420. The application 414 may transmit an input-output request (IOR) for input/output of the UFS device 420 to the UFS driver 413. The IOR may include one or more of a data read request, a data write request, and/or a data discard request, but example embodiments are not limited thereto.

The UFS driver 413 may manage the UFS host controller 411 through a UFS-host controller interface (HCI). The UFS driver 413 may convert an input-output request, generated by the application 414, into a UFS command defined by a UFS standard and may transmit the UFS command to the UFS host controller 411. A single input-output request may be converted into a plurality of UFS commands A UFS command may be a command defined by a small computer small interface (SCSI) standard, and/or may be an exclusive command for the UFS standard.

The UFS host controller 411 may transmit the UFS command, converted by the UFS driver 413, to the UIC layer 425 of the UFS device 420 through the UIC layer 416 and the UFS interface 430. In this process, a UFS host register 412 of the UFS host controller 411 may function as a command queue (CQ).

The UIC layer 416 on a side of the UFS host 410 may include a MIPI M-PHY 417 and a MIPI UniPro 418, and the UIC layer 425 on a side of the UFS device 420 may also include a MIPI M-PHY 426 and a MIPI UniPro 1252.

The UFS interface 430 may include a line transmitting a reference clock signal REF_CLK, a line transmitting a hardware reset signal RESET_n for the UFS device 420, a pair of lines transmitting a pair of differential input signals DIN_t and DIN_c, and a pair of lines transmitting a pair of differential output signals DOUT_t and DOUT_c.

A frequency value of the reference clock signal REF_CLK, provided from the UFS host 410 to the UFS device 420, may be one of 19.2 MHz, 26 MHz, 38.4 MHz, and 52 MHz, but example embodiments are not limited thereto. The UFS host 410 may change the frequency value of the reference clock signal REF_CLK even while operating or exchanging data with the UFS device 420. The UFS device 420 may generate clock signals having different frequencies from the reference clock signal REF_CLK, received from the UFS host 410, using a phase-locked loop (PLL) or the like. Also, the UFS host 410 may set a value of a data rate between the UFS host 410 and the UFS device 420 using the frequency value of the reference clock signal REF_CLK. For example, the value of the data rate may be determined depending on the frequency value of the reference clock signal REF_CLK.

The UFS interface 430 may support multiple lanes, and each of the multiple lanes may be implemented as a differential pair. For example, the UFS interface 430 may include at least one receive lane and at least one transmit lane. In FIG. 22, a pair of lines transmitting the pair of differential input signals DIN_T and DIN_C may constitute or be included in a receive lane, and a pair of lines transmitting the pair of differential output signals DOUT_T and DOUT_C may constitute or be included in a transmit lane. Although a single transmit lane and a single receive lane are illustrated in FIG. 22, the numbers of transmit lanes and the number of receive lanes may vary, and may be the same or may be different from one another.

A receive lane and a transmit lane may transmit data in a serial communication mode or a parallel mode. Since the receive lane is separated from the transmit lane, the UFS host 410 may communicate with the UFS device 420 in a full-duplex mode. For example, the UFS device 420 may transmit data to the UFS host 410 through the transmit lane even while receiving data from the UFS host 410 through the receive lane. Control data such as a command from the UFS host 410 to the UFS device 420 may be transmitted through the same lane as user data to be stored in the nonvolatile memory 424 of the UFS device 420 or to be read from the nonvolatile memory 424. Accordingly, other lanes for data transmission than a pair of a receive lane and a transmit lane may not be provided between the UFS host 410 and the UFS device 420.

The UFS device controller 421 of the UFS device 420 may control the overall operation of the UFS device 420. The UFS device controller 421 may manage the nonvolatile memory 424 through a logical unit (LU) 422, a logical data storage unit. The number of logical units 422 may be eight, but is not limited thereto. The UFS device controller 421 may include a flash translation layer (FTL) and may translate a logical address data, for example, a logical block address (LBA), received from the UFS host 410 into a physical data address, for example, a physical block address (PBA), using address mapping information of the FTL. A logical block for storing user data in the UFS system 400 may have a size in a predetermined or dynamically determined range. For example, a small size such as a minimum size of a logical block may be set to 4 Kbytes.

When a command from the UFS host 410 is input to the UFS device 420 through the UIC layer 425, the UFS device controller 421 may perform an operation corresponding to the command and may transmit a completion response to the UFS host 410 after the operation is completed.

As an example, when the UFS host 410 stores user data in the UFS device 420, the UFS host 1100 may transmit a data storage command to the UFS device 420. When receiving a response corresponding to ready-to-transfer from the UFS device 420, the UFS host 410 may transmit the user data to the UFS device 420. The UFS device controller 421 may temporarily store the user data in the device memory 428, and may store the user data, temporarily stored in the device memory 428, in a selected location of the nonvolatile memory 424 based on the address mapping information of the FTL.

As another example, when the UFS host 410 reads the user data stored in the UFS device 420, the UFS host 410 may transmit a data read command to the UFS device 420. The UFS device controller 421, receiving a command, may read the user data from the nonvolatile memory 424 based on the data read command, and may temporarily store the user data, which has been read, in the device memory 428. In such a read operation, the UFS device controller 421 may detect and correct an error in the user data, which has been read, using an embedded error correction code (ECC) engine. For example, the ECC engine may generate parity bits with respect to data to be written to the nonvolatile memory 424, and the generated parity bits may be stored in the nonvolatile memory 424 together with the write data. When data is read from the nonvolatile memory 424, the ECC engine may correct an error in the data using parity bits read from the nonvolatile memory 424 together with the data, and may output error-corrected read data.

The UFS device controller 421 may transmit the user data, which has been temporarily stored in the device memory 428, to the UFS host 410. The UFS device controller 421 may further include an encryption engine such as an advanced encryption standard (AES) engine. The AES engine may perform at least one of encryption and decryption operations of data input to the UFS device controller 421 using a symmetric-key algorithm.

The UFS host 410 may sequentially store commands to be transmitted to the UFS device 412 in the UFS host register 412, which may function as a command queue, and may sequentially transmit the commands to the UFS device 420. In this case, even while a command transmitted to the UFS device 420 is being processed by the UFS device 420, for example, even before the UFS host 410 is notified that a command transmitted to the UFS device 420 has been completely processed by the UFS device 420, the UFS host 410 may transmit a subsequent command in the command queue to the UFS device 420, and the UFS device 420 may receive the subsequent command from the UFS host 410 even while processing the previously received command A queue depth, for example, a large depth or the maximum number of commands which may be stored in the command queue, may be 32. The command queue may be implemented as a circular queue in which a head pointer and a tail pointer respectively indicate the beginning and end of a command sequence stored therein.

Supply voltages VCC, VCCQ, and VCCQ2 may be input to the UFS device 420. The supply voltage VCC may be a main supply voltage for the UFS device 1200 and may have a value of about 2.4 volts to about 3.6 volts. The supply voltage VCCQ may be used for supply of a voltage in a low range, and may be mainly used for the UFS device controller 421. The supply voltage VCCQ may have a value of about 1.14 volts to about 1.26 volts. The supply voltage VCCQ2 may be used to supply a voltage, lower than the supply voltage VCC and higher than the supply voltage VCCQ, and may be mainly used for an input/output interface such as the MIPI M-PHY 426. The supply voltage VCCQ2 may have a value of about 1.7 volts to about 1.95 volts. Each of the supply voltages VCC, VCCQ, and VCCQ2 may be supplied to a corresponding element of the UFS device 420 through a regulator 1260. The regulator 1260 may be implemented as a group of regulator units, respectively connected to one or more of the supply voltages VCC, VCCQ, and VCCQ2.

The UFS device 420 may perform an operation of generating an eye diagram, as described in the example embodiments described with reference to FIGS. 1 to 21. As an example, the MIPI M-PHY 426 may sample the data signal, received through the UFS interface 430, with a clock signal having a frequency, greater than the data rate of the UFS interface 430, and an error clock signal having a predetermined and/or dynamically determined phase difference with the clock signal, and may then compare the data and error data with each other to generate an eye diagram. The MIPI M-PHY 426 may compare each of a plurality of pieces of error data, sampled for a time corresponding to a unit interval of a data signal, with the data to estimate the eye diagram of the data signal in a single unit interval.

As described above, data obtained by sampling a data signal with a clock signal during a single unit interval may be compared with each of a plurality of pieces of error data obtained by sampling the data signal with an error clock signal having a phase, different from that of the clock signal, during the single unit interval. Accordingly, even when a frequency of the clock signal is greater than a frequency of the data signal, an eye diagram of a data signal corresponding to the single unit interval may be obtained and, in a semiconductor device operating in an oversampling manner, monitoring may be effectively performed as to whether the phase of the clock signal, the reference voltage, and/or the like, are accurately set. Thus, in the event that the eye diagram indicates inaccuracies, the semiconductor device may more efficiently improve upon the inaccuracies, based on the improved monitoring of the data eye.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc. Although one component may be described and illustrated as performing a particular function while another component may be described and illustrated as performing another particular function, example embodiments are not limited thereto, and there may be a single component that performs both functions illustrated as being performed by multiple components.

While various example embodiments have been shown and described above, it will be apparent to those of ordinary skill in the art that modifications and variations could be made without departing from the scope of the present inventive concept as defined by the appended claims. Furthermore example embodiments are not necessarily mutually exclusive with one another. For example, some example embodiments may include one or more features described with reference to one or more drawings, and may also include one or more other features described with reference to one or more other drawings.

What is claimed is:

1. A semiconductor device comprising:
processing circuitry configured to receive a data signal having a first frequency and to sample the data signal with a clock signal having a second frequency, greater than the first frequency, and to output data for a time corresponding to a unit interval of the data signal,
the processing circuitry configured to sample the data signal with an error clock signal having the second frequency and a phase, different from a phase of the clock signal, and to output a plurality of pieces of error data for the time corresponding to the unit interval, and
the processing circuitry configured to compare the data with each of the plurality of pieces of error data to obtain an eye diagram of the data signal in the unit interval.

2. The semiconductor device of claim 1, wherein, the second frequency is equal to N times the first frequency (where N is a positive integer greater than or equal to 2), and the processing circuitry is configured to output N pieces of error data during the unit interval.

3. The semiconductor device of claim 1, wherein the processing circuitry includes,
a first data flip-flop configured to operate in synchronization with the clock signal and to store the data, and
a second data flip-flop configured to operate in synchronization with a sampling clock signal having a third frequency, less than the second frequency, and configured to store an output of the first data flip-flop.

4. The semiconductor device of claim 3, wherein the processing circuitry includes,
a first error flip-flop configured to operate in synchronization with the error clock signal and to store the error data, and
a second error flip-flop configured to operate in synchronization with the sampling clock signal and to store an output of the first error flip-flop.

5. The semiconductor device of claim 4, wherein:
the first error flip-flop includes a first error latch configured to store the error data, and a second error latch configured to store an output of the first error latch; and
the processing circuitry is further configured to select one of the output of the first error latch and an output of the first error latch and to input the selected output to the second error flip-flop.

6. The semiconductor device of claim 5, wherein:
one of the output of the first error latch and the output of the second error latch has the same phase as the output of the first data flip-flop; and
the other one of the output of the first error latch and the output of the second error latch has a phase, different from a phase of the output of the first data flip-flop.

7. The semiconductor device of claim 3, wherein:
the frequency of the sampling clock signal is equal to ½ times the second frequency.

8. The semiconductor device of claim 1, wherein:
the error clock signal includes a plurality of error clock signals having different phases; and
the processing circuitry is configured to sample the data signal with each of the plurality of error clock signals to output the plurality of pieces of error data.

9. The semiconductor device of claim 1, wherein the processing circuitry is further to accumulate and transmit the data and the error data for a time, to select and output one of the plurality of pieces of error data, and to determine a phase of the clock signal and a phase of the error clock signal.

10. The semiconductor device of claim 9, wherein:
the processing circuitry includes circuitry for data sampling, error sampling, and accumulating a transmitting in analog circuit region of the processing circuitry, and the processing circuitry includes second circuitry for eye opening monitoring in a digital circuit region of the processing circuitry.

11. The semiconductor device of claim 1, wherein:
the processing circuitry is configured to adjust a reference voltage input to processing circuitry.

12. A semiconductor device comprising:
processing circuitry configured to receive a data signal having a first frequency,
configured to sample the data signal with a clock signal having a second frequency, greater than the first frequency, to sequentially output first data and second data, and to sample the data signal with each of error clock signals having the second frequency and a phase difference from the clock signal to sequentially output first error data and second error data, the error clock signals having phase differences from the clock signal, respectively, and
configured to generate an eye diagram of the data signal in a unit interval defined by the first frequency, wherein:
the processing circuitry is configured to compare the second data with the first error data to generate the eye diagram of the data signal in a first time of the unit interval, and to compare the second data with the second error data to generate the eye diagram of the data signal in a second time, sequent to the first time, of the unit interval.

13. The semiconductor device of claim 12, wherein:
the second frequency is equal to twice of the first frequency, and a sum of the first time and the second time is equal to the unit interval.

14. The semiconductor device of claim 12, wherein:

the second frequency is equal to four times of the first frequency; and during the unit interval, the processing circuitry is configured to output third data between the first data and the second data, outputs fourth data subsequent to the second data, and further outputs third error data and fourth error data subsequent to the second error data.

15. The semiconductor device of claim 14, wherein:

the processing circuitry is configured to compare the second data with the third error data to generate the eye diagram of the data signal in a third time, sequent to the second time, of the unit interval and compares the second data with the fourth error data to generate the eye diagram of the data signal in a fourth time, subsequent to the third time, of the unit interval.

16. The semiconductor device of claim 12, wherein:

the processing circuitry is configured to match a phase of the first data with a phase of the first error data.

17. The semiconductor device of claim 12, wherein:

the processing circuitry is configured to sample the data signal with the error clock signal $2^n$ times (where n is a positive integer) to output $2^n$ pieces of the first error data and $2^n$ pieces of the second error data, and to compare the second data with the $2^n$ pieces of the first error data and compares the second data with the $2^n$ pieces of the second error data to generate the eye diagram of the data signal.

18. A semiconductor device comprising:

processing circuitry configured to receive a data signal having a first frequency, configured to sample the data signal with each of a clock signal and an error clock signal having a second frequency, greater than the first frequency, and to sequentially output a plurality of pieces of data and a plurality of pieces of error data during a single period the data signal, and configured to output a single piece of data and ignore the other pieces of data, among the plurality of pieces of data, and to output all of the plurality of pieces of error data in response to the processing circuitry receiving the plurality of pieces of data and the plurality of pieces of error data, and configured to compare the single piece of data with each of the plurality of pieces of error data to generate an eye diagram of the data signal within the single period.

19. The semiconductor device of claim 18, wherein:

the processing circuitry is configured to align a phase of the clock signal and a phase of the data signal based on a result of sampling the data signal with each of the clock signal and a complementary clock signal having a phase opposite to the clock signal.

20. The semiconductor device of claim 18, wherein:

the processing circuitry is configured to align phases of the plurality of pieces of error data with phases of the plurality of pieces of data, in response a select signal, and to output the plurality of pieces of data and the plurality of pieces of error data.

* * * * *